(12) United States Patent
Itaya

(10) Patent No.: US 9,501,095 B2
(45) Date of Patent: Nov. 22, 2016

(54) DISPLAY DEVICE

(75) Inventor: Hideki Itaya, Kanagawa (JP)

(73) Assignee: NLT TECHNOLOGIES, LTD., Kanagawa (JP)

( * ) Notice: Subject to any disclaimer, the term of this patent is extended or adjusted under 35 U.S.C. 154(b) by 205 days.

(21) Appl. No.: 14/114,667

(22) PCT Filed: May 30, 2011

(86) PCT No.: PCT/JP2011/062426
§ 371 (c)(1),
(2), (4) Date: Oct. 29, 2013

(87) PCT Pub. No.: WO2012/164676
PCT Pub. Date: Dec. 6, 2012

(65) Prior Publication Data
US 2014/0063707 A1  Mar. 6, 2014

(51) Int. Cl.
*G02F 1/1333* (2006.01)
*G06F 1/16* (2006.01)
*H05K 7/14* (2006.01)

(52) U.S. Cl.
CPC .......... *G06F 1/1601* (2013.01); *G06F 1/1656* (2013.01); *H05K 7/14* (2013.01)

(58) Field of Classification Search
CPC .............. G02F 1/133308; G02F 2001/133314; G02F 2001/133317; G02F 2001/13332; G02F 2001/133331; G02F 1/133608; G02F 2001/133322; G02F 2001/133325; G02F 2202/28; G02F 2201/46; G02F 1/13338; G02F 1/133504

USPC ............................................. 349/58
See application file for complete search history.

(56) References Cited

U.S. PATENT DOCUMENTS

2007/0279547 A1* 12/2007 Tanaka ........................ 349/58
2008/0210843 A1   9/2008 Han et al.
2010/0245707 A1*  9/2010 Harada ........................ 349/58
2011/0007391 A1*  1/2011 Takahashi ................... 359/485
(Continued)

FOREIGN PATENT DOCUMENTS

CN  101221309 A  7/2008
CN  201583763 U  9/2010
(Continued)

OTHER PUBLICATIONS

Communication dated Mar. 3, 2015 from the Japanese Patent Office in counterpart application No. 2013-517736.
(Continued)

*Primary Examiner* — Hoan C Nguyen
(74) *Attorney, Agent, or Firm* — Sughrue Mion, PLLC

(57) ABSTRACT

A display device prevents a foreign material from entering from a gap formed between an adhesive member and a chassis, said gap being formed due to having a structure simplified. The upper surface of a resin chassis, said upper surface facing a touch panel, is provided with steps having a height equal to a thickness of a double-sided tape or less. The double-sided tape is disposed in a region, which is at the lower level of the steps. In a region where and end portion of the double-sided tape is disposed, wall at a level equivalent to the upper level of the steps is provided such that double-sided tapes and a display device are spatially separated from each other.

14 Claims, 23 Drawing Sheets

(56) References Cited

U.S. PATENT DOCUMENTS

2012/0162563 A1* 6/2012 Lai et al. .................. 349/58

FOREIGN PATENT DOCUMENTS

| | | | |
|---|---|---|---|
| JP | 11-330730 A | | 11/1999 |
| JP | 2005-222091 A | | 8/2005 |
| JP | 2005-242423 A | | 9/2005 |
| JP | 2005321614 A | | 11/2005 |
| JP | 2006105654 A | * | 4/2006 |
| JP | 200735536 A | | 2/2007 |
| JP | 2007-293810 A | | 11/2007 |
| JP | 2008015885 A | | 1/2008 |
| JP | 201060658 A | | 3/2010 |
| JP | 3159189 U | | 5/2010 |
| JP | 2010250356 A | | 11/2010 |
| WO | 2010/021357 A | | 2/2010 |

OTHER PUBLICATIONS

Communication dated Sep. 1, 2015 from the State Intellectual Property Office of the People's Republic of China in counterpart application No. 201180071259.X.

Communication dated Jul. 21, 2015 from the Japanese Patent Office in counterpart application No. 2013-517736.

* cited by examiner

DISPLAY DEVICE

TECHNICAL FIELD

The present invention relates to a display device such as a liquid crystal display device, an organic EL display, or the like, for example.

BACKGROUND ART

Recently, there have been more display devices provided with a protection panel such as a touch panel, and those display devices tend to be in a large size. In general, the protection panel is fixed to a chassis or the like via a double-sided tape, and a spatial gap is provided between the protection panel and the display panel. This spatial gap prevents display failures on the display panel caused due to a pressure applied to the protection panel through blocking the influence of flexure of the protection panel. Further, there are cases where a slit is provided to the double-sided tape used for fixing the protection panel so that the spatial gap is not in a sealed state.

Now, the related technique depicted in Patent Document 1 will be described by referring to the drawings. FIG. 22 is a fragmented perspective view showing a touch screen display device of the related technique. FIG. 23 is a plan view showing an adhesive member in the touch screen display device of FIG. 22.

The touch screen display device of the related technique includes a display panel 610, a touch panel 630, and an adhesive member 650. In the display panel 610, an effective display area DA and a peripheral area PA surrounding the effective display area DA are defined, and a flexible substrate 612 is connected thereto. The adhesive member 650 is interposed between the display panel 610 and the touch panel 630 in the peripheral area PA defined in the display panel 610 to bond those to each other. On the inner side of the adhesive member 650, a polarization film 617 is laminated.

Among the adhesive member 650, a ventilation path 657 is formed in the vicinity of each of the centers (B part) of two long sides of the peripheral area PA of the display panel 610. Air is flown in or out to/from the space between the touch panel 630 and the display panel 610 via the ventilation path 657. The adhesive member 650 includes first and second adhesive tapes 653 and 655. The ventilation path 657 is formed by a protruded portion and a recessed portion engaged with each other formed in the ends of each of the first and the second adhesive tapes 653 and 655, and forms a shape bent at four positions. The air pressure of the space surrounded by the adhesive member 650 changes according to the external pressure of the display device by the ventilation path 657. Further, the bent parts of the complicated-shaped ventilation 657 confine foreign matters so as to prevent intrusion of the foreign matters to the inside of the display device.

Further, Patent Document 2 discloses a display device in which a complicated-shaped ventilation path is formed by processing an adhesive member of a touch panel. Patent Document 3 discloses a display device of a complicated structure in which a dust-proof spacer is attached to a touch panel.

Patent Document 1: Japanese Unexamined Patent Publication 2007-293810

Patent Document 2: Registered Utility Model No. 3159189

Patent Document 3: Japanese Unexamined Patent Publication 2005-242423

With the display device having the structure where the protection panel such as a touch panel is fixed to a resin chassis via a double-sided tape, image quality failures including distortion of the images and deterioration of the image quality are generated when a foreign matter enters from a gap generated at the position where the double-sided tape is pasted or a gap generated due to the thickness of the double-sided tape. When the shape of the double-sided tape is made complicated for preventing the foreign matter from entering as a countermeasure, the cost for the double-sided tape is increased because the amount of the double-sided tape to be wasted is increased. In addition, to paste the complicated-shaped double-sided tape is extremely bad in terms of the workability. This issue has become serious in accordance with recent increase in the scale of the display devices in particular.

It is therefore an object of the present invention to provide a display device with which it is possible to prevent a foreign matter from entering from the gap between a chassis and a protection panel even when an adhesive member for fixing the chassis and the protection panel is formed in a simple shape. Thereby, the part of the adhesive member to be wasted can be decreased, and the work for fixing the chassis and the protection film can be simplified. That is, the object of the present invention is to prevent intrusion of the foreign matter from the gap formed between the adhesive member and the chassis generated when the structure is simplified.

DISCLOSURE OF THE INVENTION

The display device according to the present invention is characterized to include: a display panel; a protection panel placed on a display surface of the display panel via a space; a chassis for housing the display panel; and an adhesive member for fixing the protection panel to the chassis, wherein:
a step of height equal to or less than thickness of the adhesive member is provided on a top surface of the chassis opposing to the protection panel;
the adhesive member is placed in a region to be a lower level of the step; and
a wall corresponding to an upper level of the step is provided in a region where an end portion of the adhesive member is placed so as to spatially separate the adhesive member and the display panel.

With the present invention, the wall corresponding to an upper level of the step is provided in the region where the end portion of the adhesive member is placed so as to spatially separate the adhesive member and the display panel. Therefore, it is possible to prevent intrusion of the foreign matter from the gap formed between the adhesive member and the chassis generated when the structure is simplified.

BEST MODES FOR CARRYING OUT THE INVENTION

Figure 1:
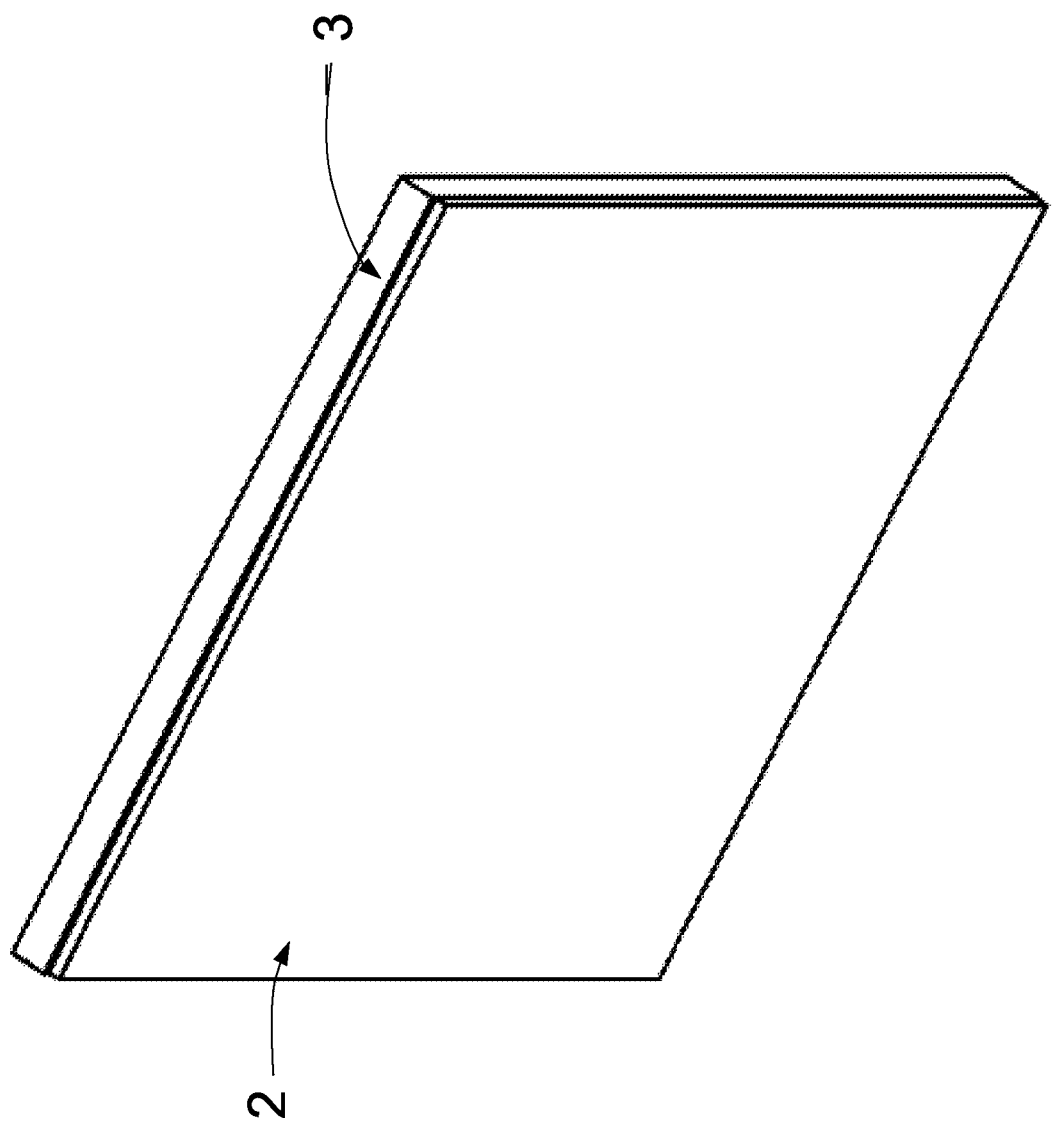
FIG. 1 is an overall perspective view showing a display device according to a first exemplary embodiment of the present invention.

Hereinafter, modes for embodying the present invention (referred to as "exemplary embodiments" hereinafter) will be described by referring to the accompanying drawings. In this Specification and the drawings, same reference numerals are applied to substantially the same structural elements.

Figure 2:
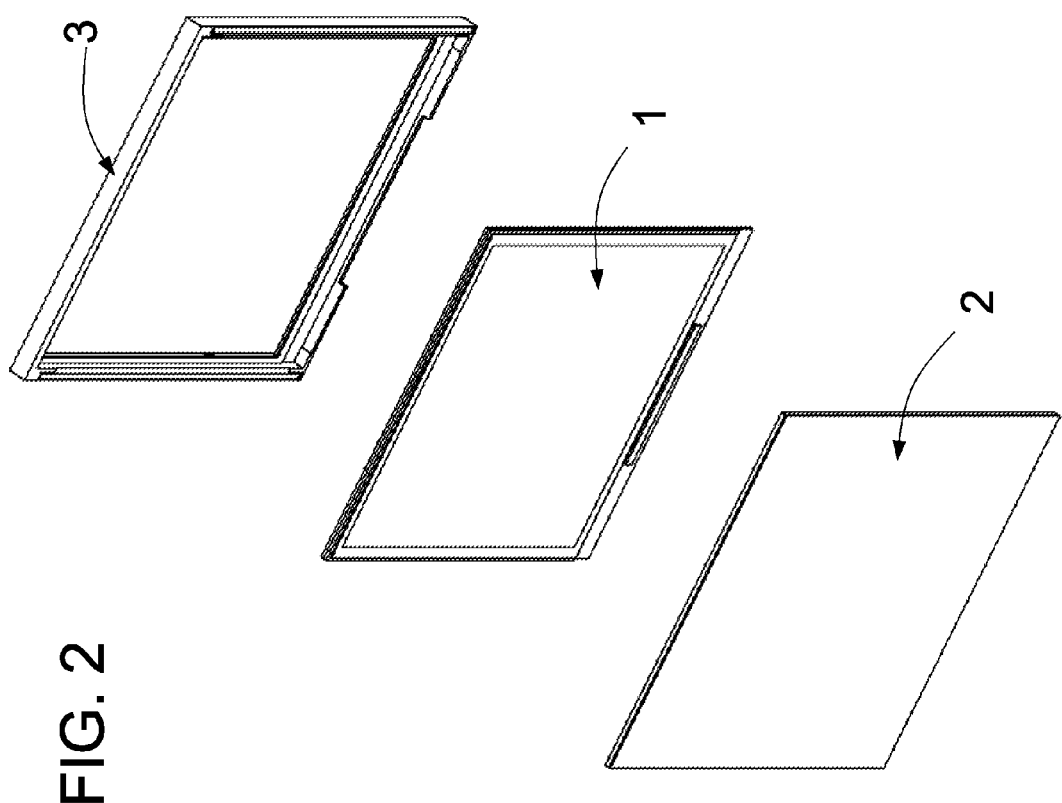
FIG. 2 is a fragmented perspective view showing the display device of FIG. 1.
Figure 3:
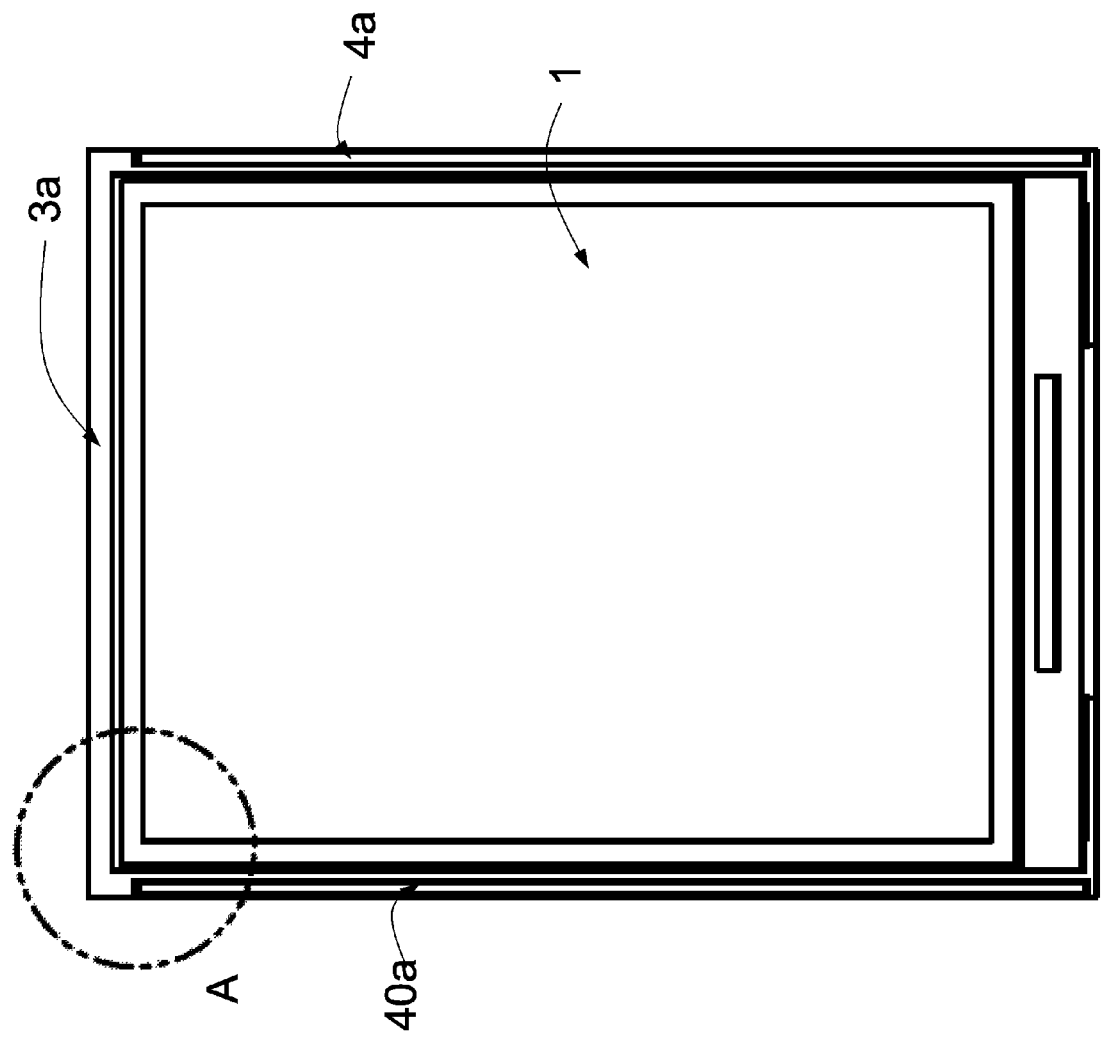
FIG. 3 is an elevational view showing a state where a touch panel is omitted from the display device of FIG. 1.
Figure 4:
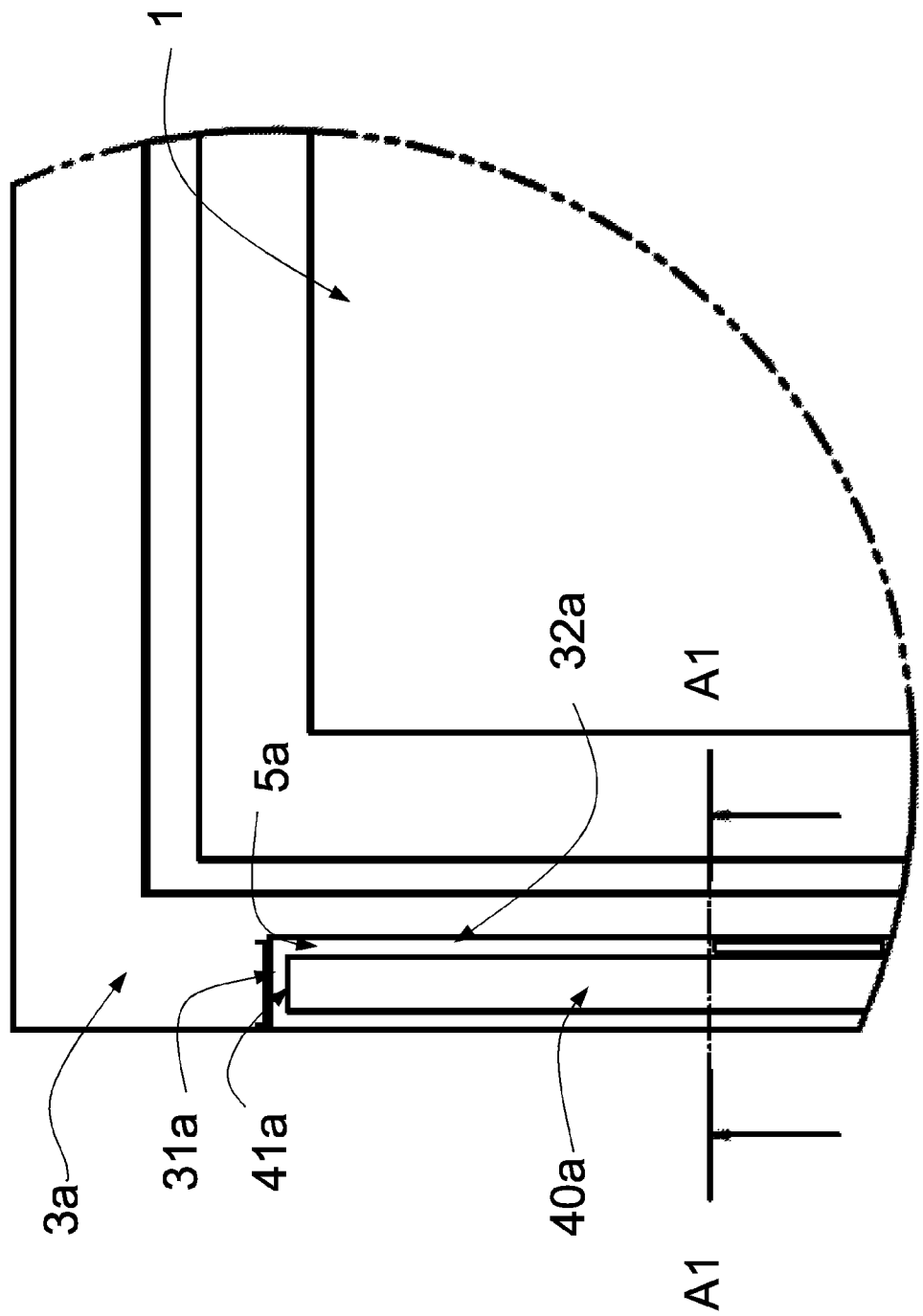
FIG. 4 is a detailed view showing A part of FIG. 3.
Figure 5:
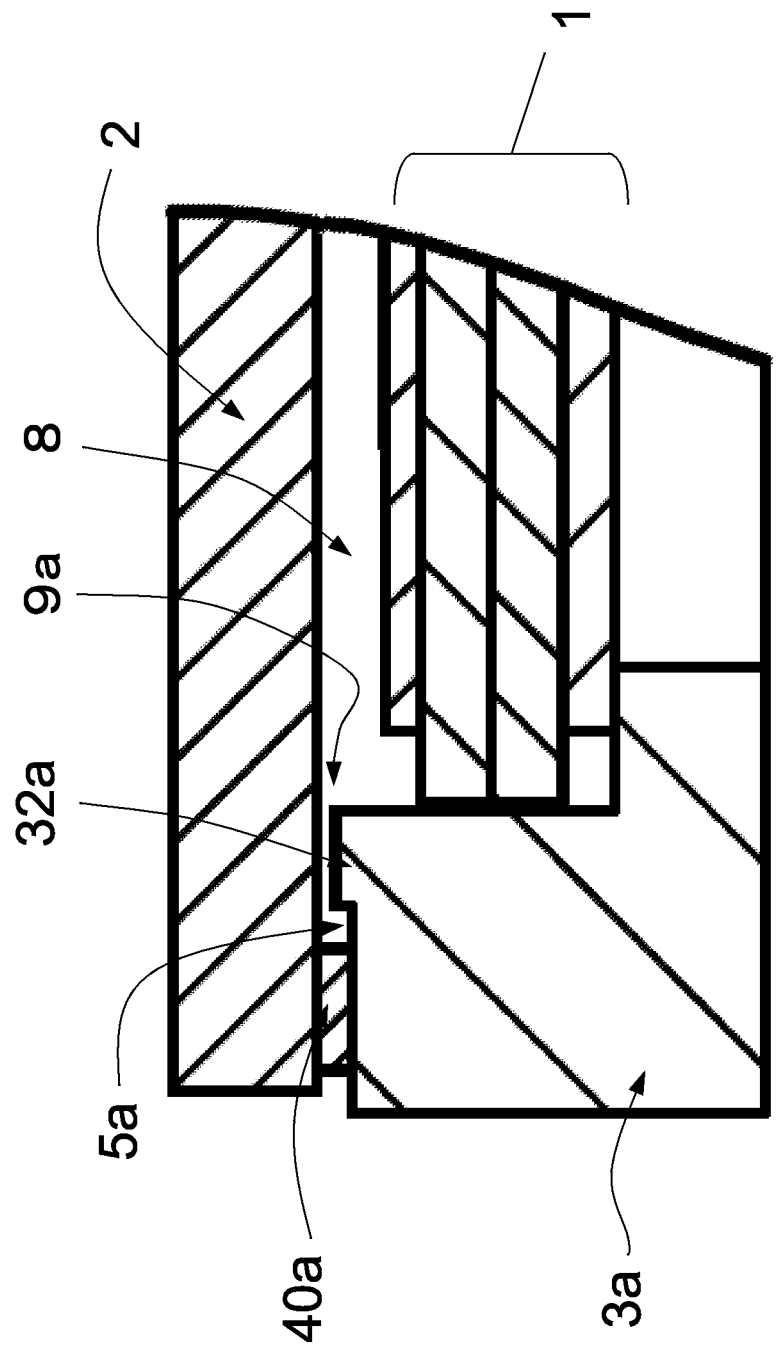
FIG. 5 is a sectional view taken along a line A1-A1 of FIG. 4, which shows the state where the touch panel is added.

FIG. 1 is an overall perspective view showing the display device of a first exemplary embodiment according to the present invention. FIG. 2 is a fragmented perspective view showing the display device of FIG. 1. FIG. 3 is an elevational view showing a state where a touch panel is omitted from the display device of FIG. 1. FIG. 4 is a detailed view showing A part of FIG. 3. FIG. 5 is a sectional view taken along a line A1-A1 of FIG. 4, which shows the state where the touch panel is added. Hereinafter, explanations will be provided by referring to those drawings.

The display device according to the first exemplary embodiment includes: a display device 1 as a display panel; a touch panel 2 as a protection panel placed on the display surface of the display device 1 via a space 8; a resin chassis 3a as a chassis for housing the display device 1; and double-sided tapes 4a and 40a as an adhesive member for fixing the touch panel 2 to the resin chassis 3a. On the top surface of the resin chassis 3a opposing to the touch panel 2, steps 31a and 32a of height equal to or less than the thickness of the double-sided tapes 4a and 40a are provided. The double-sided tapes 4a and 40a are placed in the regions to be the lower levels of the steps 31a and 32a. In the regions where an end portion 41a of the double-sided tapes 4a and 40a, a wall (step 31a) corresponding to the upper level of the steps 31a and 32a is provided to spatially separate the double-sided tapes 4a, 40a and the display device 1. With the display device according to the first exemplary embodiment, it is possible to prevent intrusion of a foreign matter from a gap between the double-sided tapes 4a, 40a and the resin chassis 3a generated by simplifying the structure.

In other words, the display device according to the first exemplary embodiment includes: the display device 1 as the display panel; the resin chassis 3a as the chassis 3 for housing the display device 1; the touch panel 2 as the protection panel for covering the display device 1 via the space 8; the double-sided tapes 4a, 40a as the adhesive member for fixing the touch panel 2 to the rim of the resin chassis 3a; and the steps 31a, 32a provided at least one of the mutually opposing faces of the resin chassis 3a and the touch panel 2, which are protruded portions for forming a clearance 9a to be a path for the air of inside and outside of the space 8. The steps 31a and 32a are provided to the resin chassis 3a, which are a first protruded plane of height lower than the thickness of the double-sided tapes 4a and 40a. The double-sided tapes 4a and 40a have an adhesive layer constituted with an adhesive agent or the like on both of the top and back sides.

The clearance 9a between the steps 31a, 32a and the touch panel 2 is narrower than the gap between the resin chassis 3a and the touch panel 2 formed by the existence of the double-sided tapes 4a, 40a, so that it functions to block intrusion of the foreign matter.

This will be described in more details hereinafter. The display device according to the first exemplary embodiment includes: the display device 1; the touch panel 2; the resin chassis 3a into which the display device 1 is fitted; and the double-sided tapes 4a, 40a for fixing the touch panel 2 to the resin chassis 3a. To the inner face of the resin chassis 3a, the double-sided tapes 4a, 40a are pasted. In the part of the inner face where the double-sided tapes 4a, 40a are not pasted, the step 31a of the height equal to or less than the thickness of the double-sided tapes 4a, 40a is provided. The touch panel 2 is fixed to the resin chassis 3a via the double-sided tapes 4a, 40a.

The structure of the side to which the double-sided tape 40a is pasted will be described herein. The step 32a of the height equal to or less than the thickness of the double-sided tape 40a is provided on the resin chassis 3a between the double-sided tape 40a and the display device 1. The clearance 9a formed between the step 32a and the touch panel 2 is set to be equal to or less than the size of the assumed foreign matter. A slit 5a formed by the end portion 41a of the double-sided tape 40a and the step 32a of the resin chassis 3a forms a shape isolated from the inner side of the display device. Further, through employing the same structure, a slit forming a shape isolated from the inner side of the display device is formed also with the structure on the side where the double-sided tape 4a is pasted.

Next, the operations and effects of the display device of the first exemplary embodiment will be described. Through providing the steps 31a, 32a of the height equal to or less than the double-sided tapes 4a, 40a to the resin chassis 3a and setting the clearance 9a between the steps 31a, 32a and the touch panel 2 as the size capable of suppressing intrusion of the foreign matter, intrusion of the foreign matters into the display device can be suppressed. Thus, it is possible to prevent the image quality failures including the distortion of the image and deterioration of the image quality which may be caused thereby. Further, since the shape of the double-sided tapes 4a, 40a can be simplified, it is possible to reduce the unnecessary part of the double-sided tape and design the layout efficiently in terms of the area. Therefore, the structure capable of suppressing intrusion of the foreign matters into the inside of the display device can be achieved at a low cost. Furthermore, since the clearance 9a between the resin chassis 3a and the touch panel 2 can be set according to the size of the assumed foreign matter without depending on the thickness of the double-sided tapes 4a, 40a, it is possible to select the double-sided tape which is high in the adhesive strength or is not easily influenced by the unevenness on the resin chassis 3a. Therefore, the fixing strength of the touch panel 2 can be increased.

Figure 6:
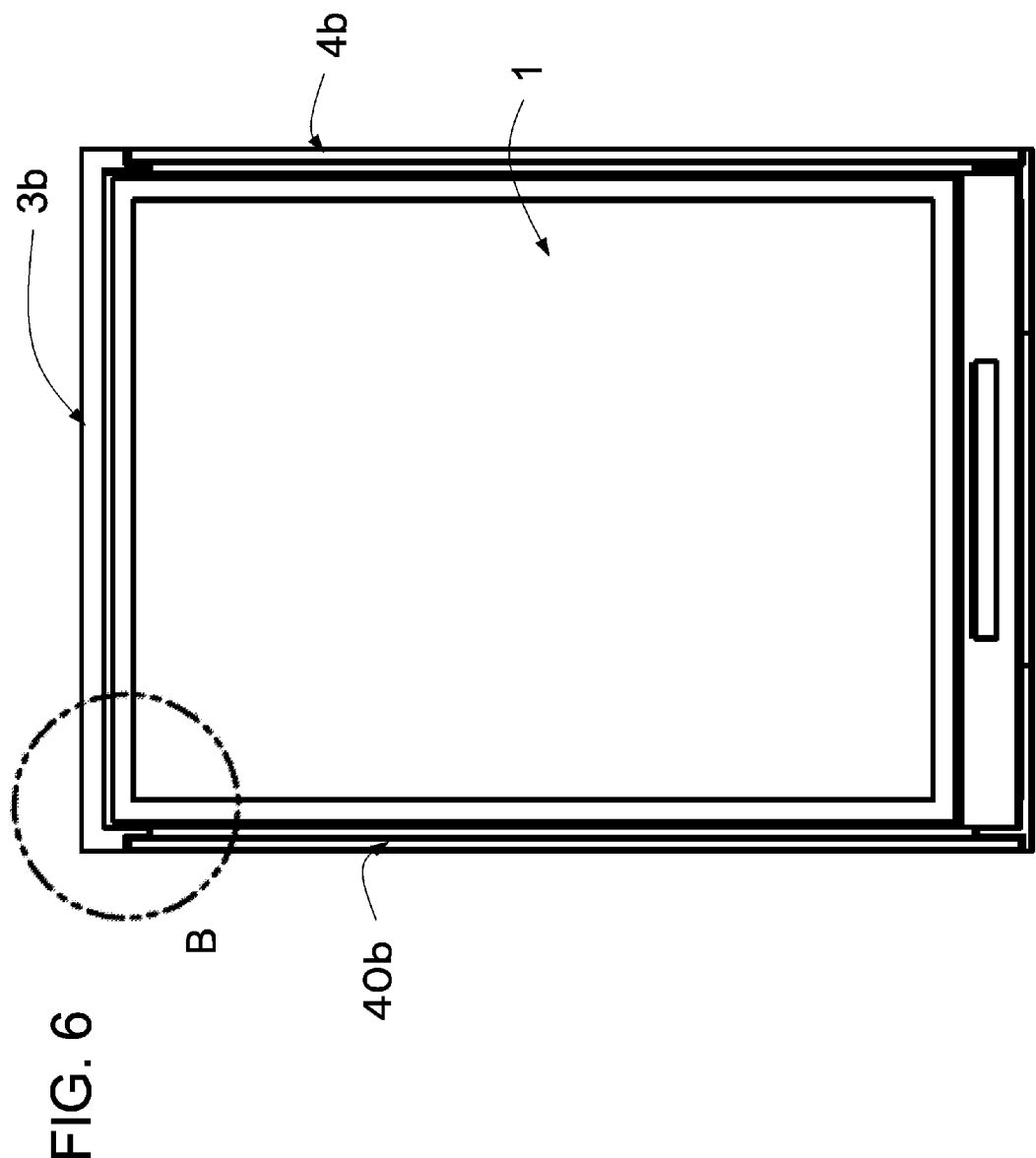
FIG. 6 is an elevational view showing a state where a touch panel is omitted from a display device according to a second exemplary embodiment of the present invention.
Figure 7:
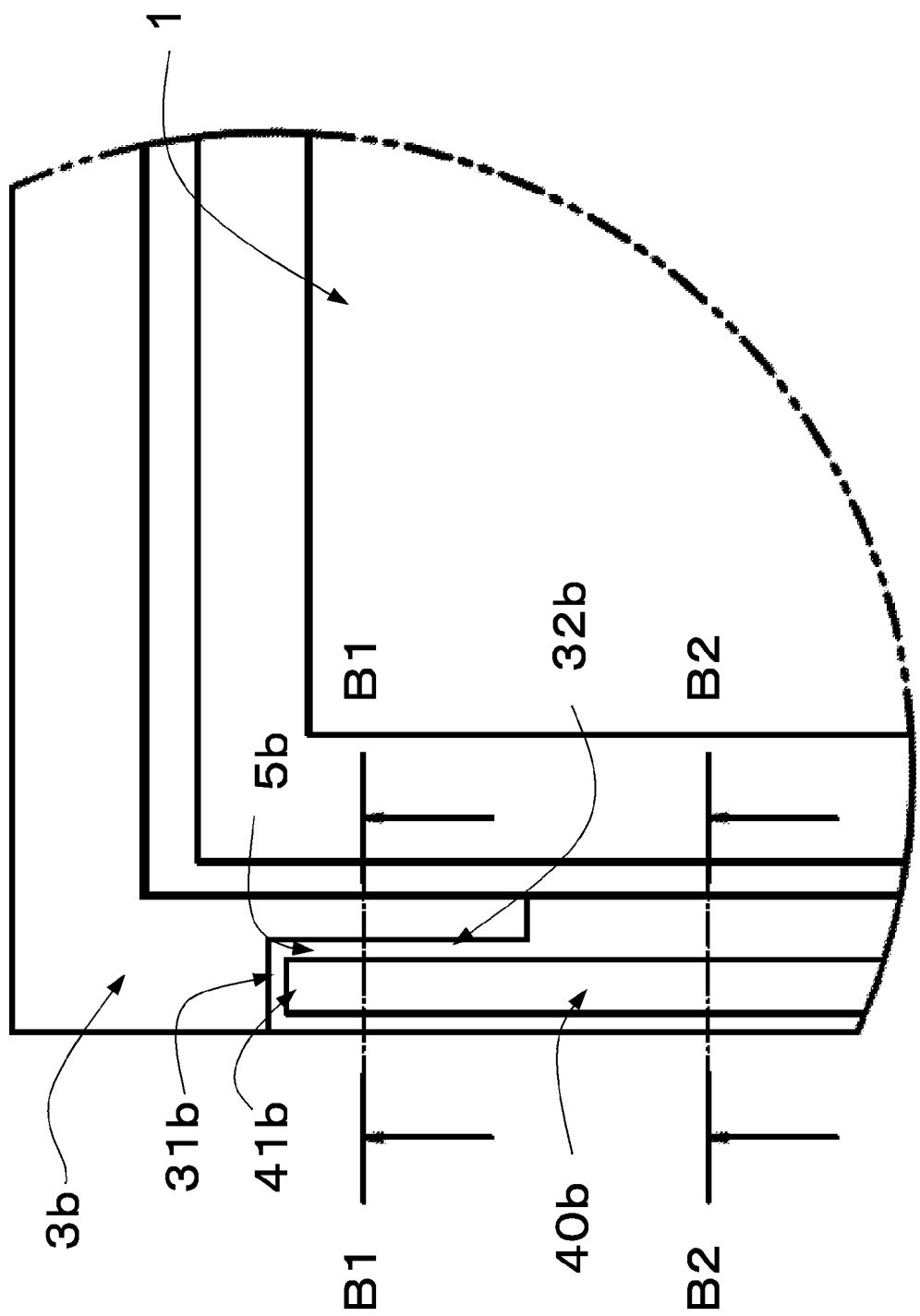
FIG. 7 is a detailed view showing B part of FIG. 6.
Figure 8:
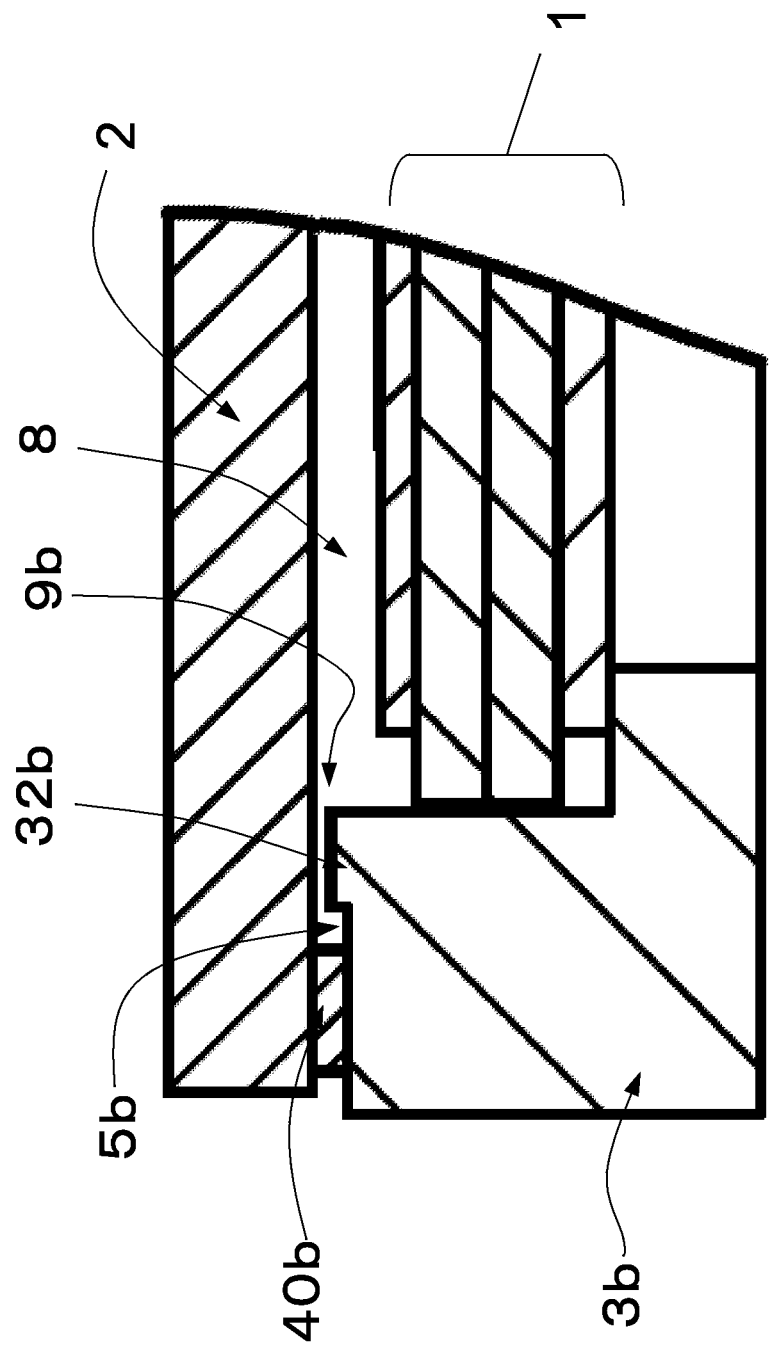
FIG. 8 is a sectional view taken along a line B1-B1 of FIG. 7, which shows the state where the touch panel is added.
Figure 9:
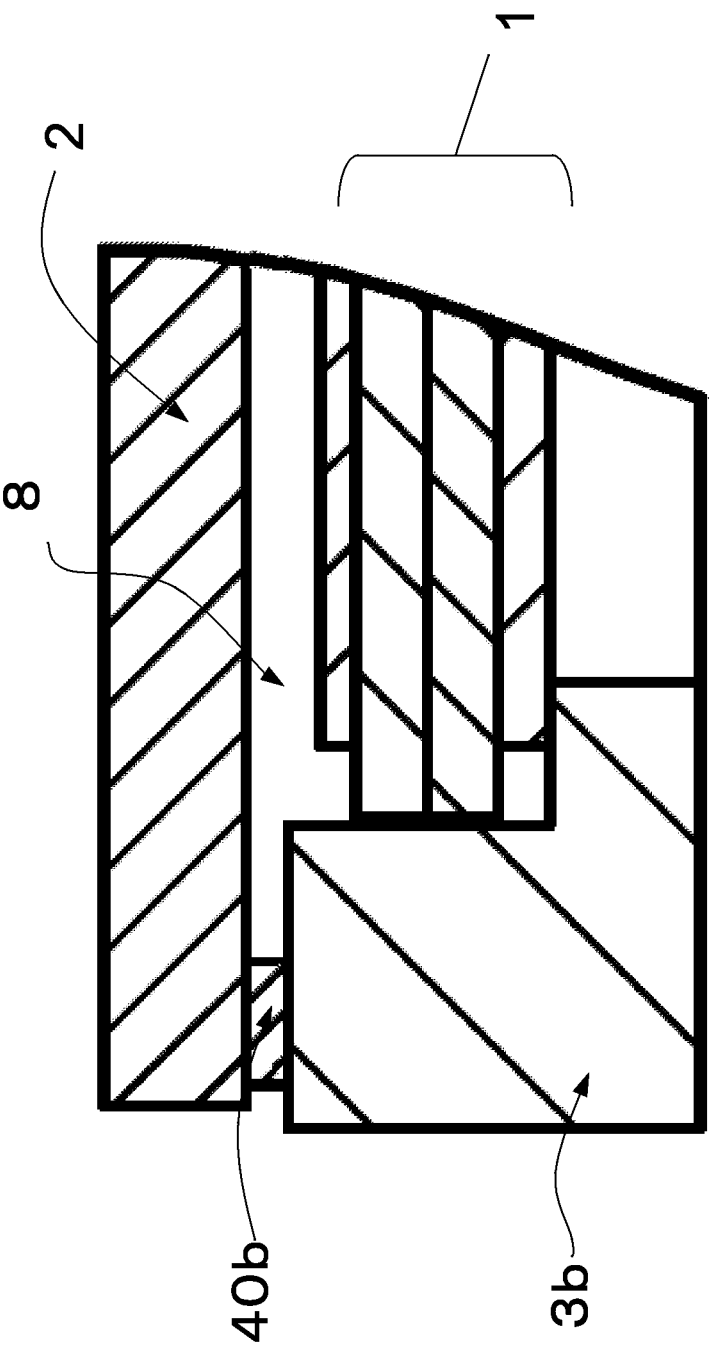
FIG. 9 is a sectional view taken along a line B2-B2 of FIG. 7, which shows the state where the touch panel is added.

FIG. 6 is an elevational view showing a state where a touch panel is omitted from a display device according to a second exemplary embodiment of the present invention. FIG. 7 is a detailed view showing B part of FIG. 6. FIG. 8 is a sectional view taken along a line B1-B1 of FIG. 7, which shows the state where the touch panel is added. FIG. 9 is a sectional view taken along a line B2-B2 of FIG. 7, which shows the state where the touch panel is added. Hereinafter, explanations will be provided by referring to those drawings.

Steps 31b and 32b of the display device according to the second exemplary embodiment are provided on a resin chassis 3b, which are a first protruded plane of the height lower than the thickness of double-sided tapes 4a and 40a. In the second exemplary embodiment, a slit 5b for capturing a foreign matter entering inside a space 8 is provided. The slit 5b forms a shape reaching from the periphery of an end portion 41b of double-sided tapes 4b, 40b to the space 8.

This will be described in more details hereinafter. The display device of the second exemplary embodiment includes: the display device 1; the touch panel 2; the resin chassis 3b into which the display device 1 is fitted; and the double-sided tapes 4b, 40b for fixing the touch panel 2 to the resin chassis 3b. To the inner face of the resin chassis 3b, the double-sided tapes 4b, 40b are pasted. In the part of the inner face where the double-sided tapes 4b, 40b are not pasted, the step 31b of the height equal to or less than the thickness of the double-sided tapes 4b, 40b is provided. The touch panel 2 is fixed to the resin chassis 3b via the double-sided tapes 4b, 40b.

The structure of the side to which the double-sided tape 40b is pasted will be described herein. The step 32b of the height equal to or less than the thickness of the double-sided tape 40b is provided on the resin chassis 3b between the double-sided tape 40b and the display device 1. A clearance 9b formed between the step 32b and the touch panel 2 is set to be equal to or less than the size of the assumed foreign matter. A slit 5b formed by the end portion 41b of the double-sided tape 40b and the step 32b of the resin chassis 3b forms a shape that is not in a straight form. Further, through employing the same structure, a slit forming a shape that is not in a straight form can be formed also with the structure on the side where the double-sided tape 4b is pasted.

Next, the operations and effects of the display device of the second exemplary embodiment will be described. In the second exemplary embodiment, the long and nonlinear slit 5b is formed by the end portion 41b of the double-sided tape 40b and the resin chassis 3b to which the steps 31b, 32b are attached, so that a foreign matter that is about to enter the display device from outside can be captured within the slit 5b. Thereby, intrusion of the foreign matter into the inside of the display device can be suppressed, so that it is possible to prevent the image quality failures including the distortion of the image and deterioration of the image quality which may be caused thereby. Further, since the shape of the double-sided tapes 4b, 40b can be simplified, it is possible to reduce the unnecessary part of the double-sided tape and design the layout efficiently in terms of the area. Therefore, the structure capable of suppressing intrusion of the foreign matters into the inside of the display device can be achieved at a low cost. Other structures, operations, and effects of the display device according to the second exemplary embodiment are the same as those of the first exemplary embodiment.

Figure 10:
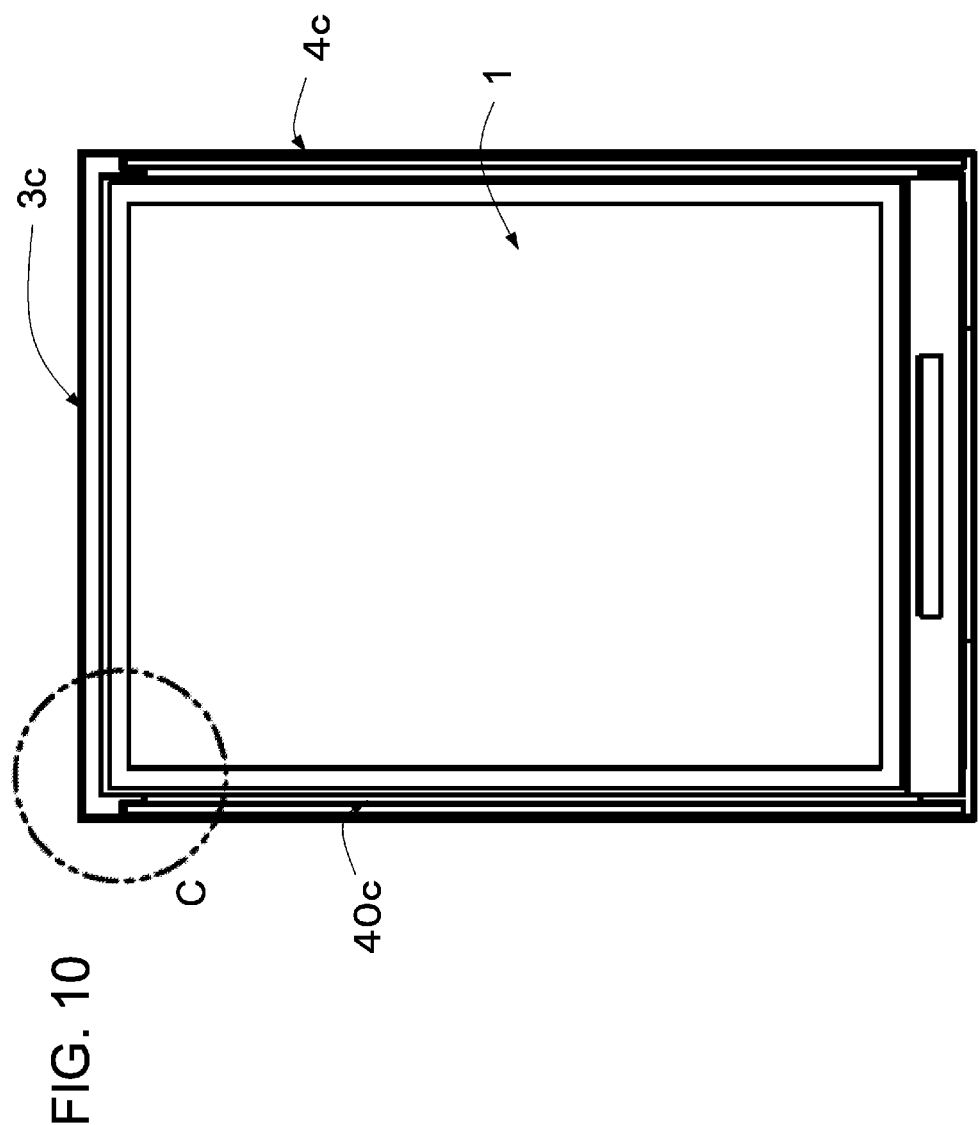
FIG. 10 is an elevational view showing a state where a touch panel is omitted from a display device according to a third exemplary embodiment of the present invention.
Figure 11:
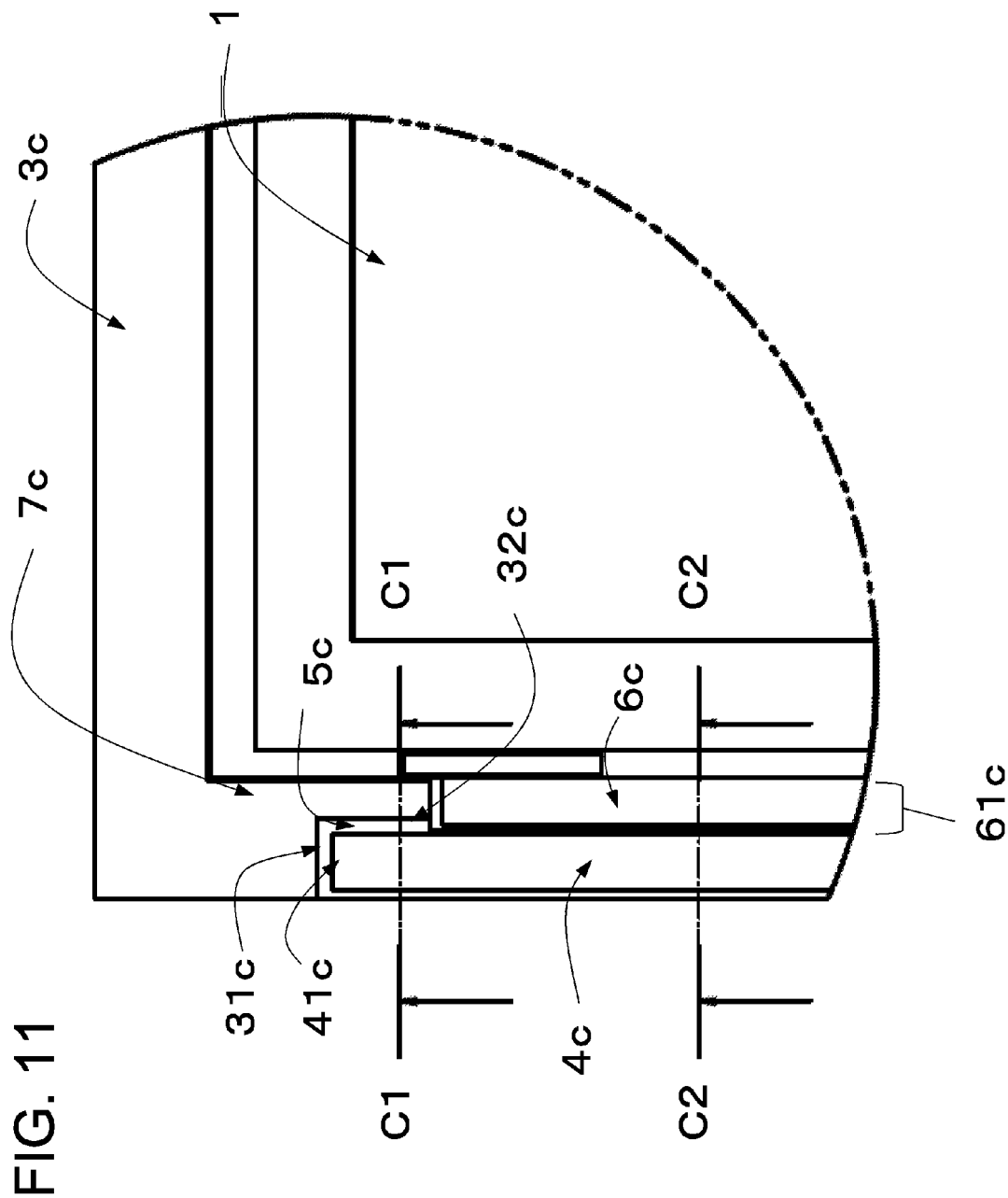
FIG. 11 is a detailed view showing C part of FIG. 10.
Figure 12:
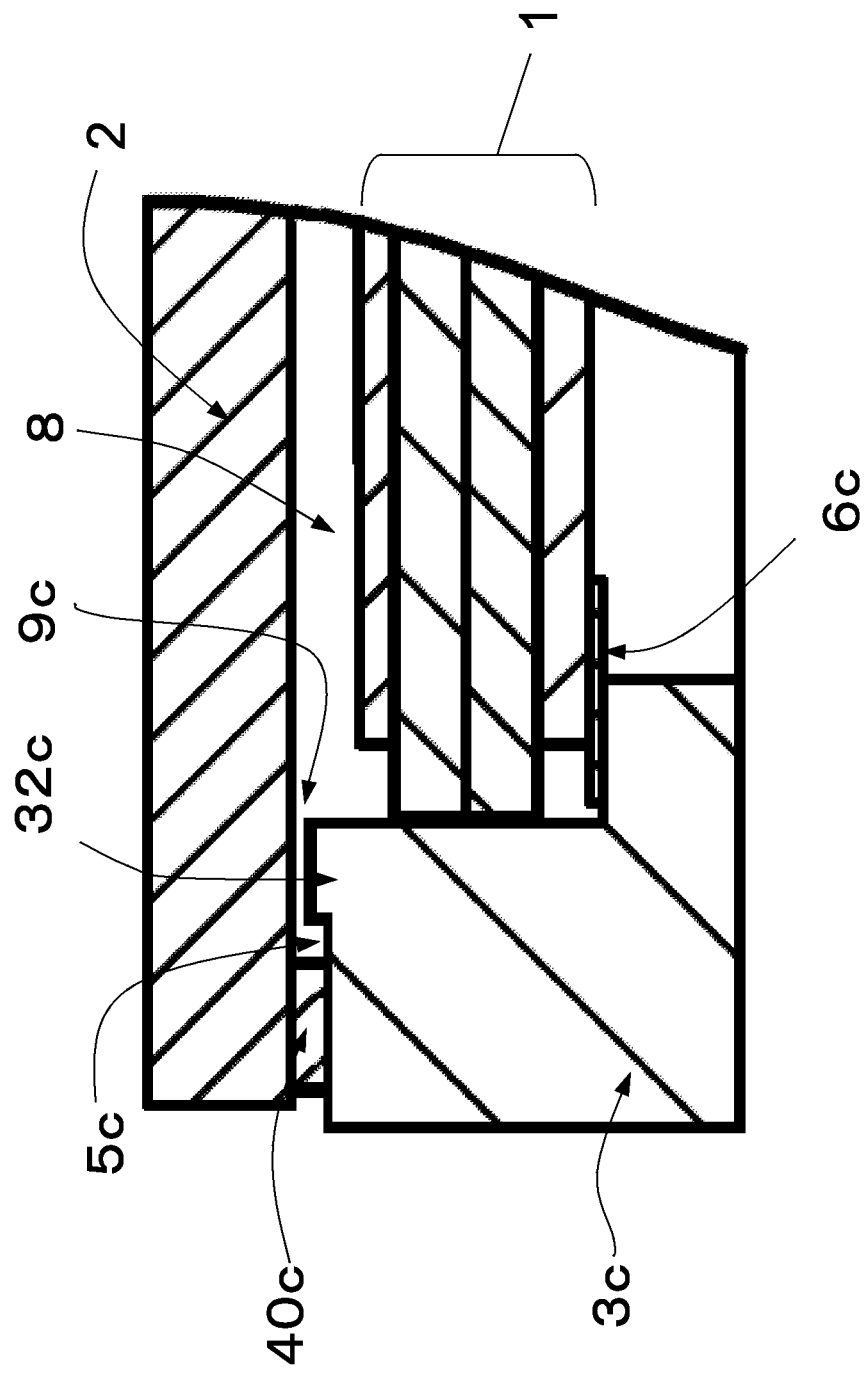
FIG. 12 is a sectional view taken along a line C1-C1 of FIG. 11, which shows the state where the touch panel is added.
Figure 13:
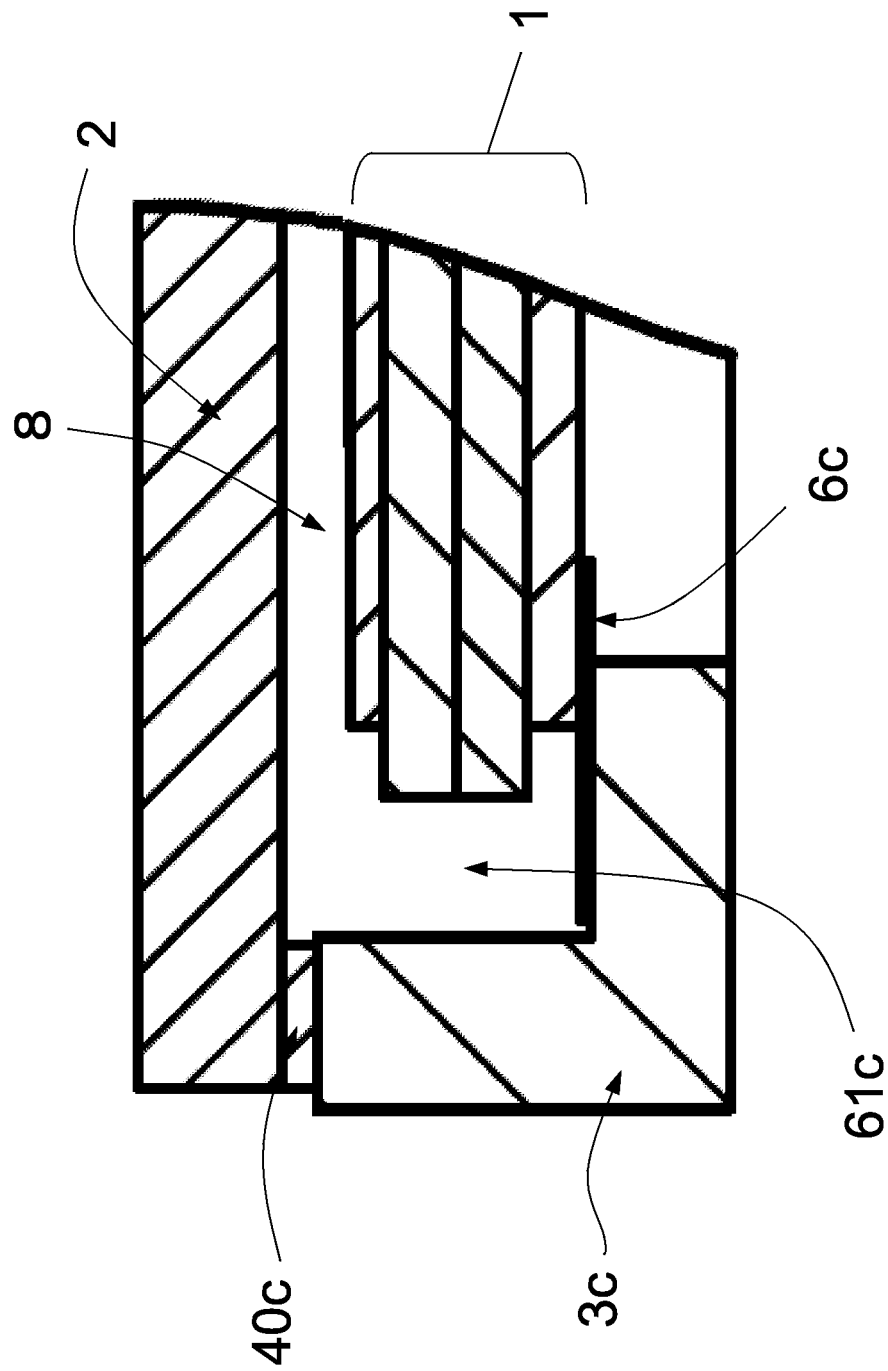
FIG. 13 is a sectional view taken along a line C2-C2 of FIG. 11, which shows the state where the touch panel is added.

FIG. 10 is an elevational view showing a state where a touch panel is omitted from a display device according to a third exemplary embodiment of the present invention. FIG. 11 is a detailed view showing C part of FIG. 10. FIG. 12 is a sectional view taken along a line C1-C1 of FIG. 11, which shows the state where the touch panel is added. FIG. 13 is a sectional view taken along a line C2-C2 of FIG. 11, which shows the state where the touch panel is added. Hereinafter, explanations will be provided by referring to those drawings.

Steps 31c and 32c of the display device according to the third exemplary embodiment are provided on a resin chassis 3c, which are a first protruded plane of the height lower than the thickness of double-sided tapes 4c and 40c. In the third exemplary embodiment, a slit 5c for capturing a foreign matter entering inside a space 8 and a double-sided tape 6c as an adhesive member for capturing a foreign matter entering inside the space 8 are provided. One of the faces of the double-sided tape 6c is bonded to the resin chassis 3c, and the other face thereof is used as the adhesive member.

This will be described in more details hereinafter. The display device of the third exemplary embodiment includes: the display device 1; the touch panel 2; the resin chassis 3c into which the display device 1 is fitted; the double-sided tapes 4c, 40c for fixing the touch panel 2 to the resin chassis 3c; and the double-sided tape 6c for fixing the display device 1 to the resin chassis 3c. To the inner face of the resin chassis 3c, the double-sided tapes 4c, 40c are pasted. In the part of the inner face where the double-sided tapes 4c, 40c are not pasted, the step 31c of the height equal to or less than the thickness of the double-sided tapes 4c, 40c is provided. The touch panel 2 is fixed to the resin chassis 3c via the double-sided tapes 4c, 40c.

The structure of the side to which the double-sided tape 40c is pasted will be described herein. The step 32c of the height equal to or less than the thickness of the double-sided tape 40c is provided on the resin chassis 3c between the double-sided tape 40c and the display device 1. A clearance 9c formed between the step 32c and the touch panel 2 is set to be equal to or less than the size of the assumed foreign matter. A slit 5c formed by the end portion 41c of the double-sided tape 40c and the resin chassis 3c forms a shape having two corners. A rib 7c for guiding the fixation of the display device 1 is provided to the resin chassis 3c. The end portion 41c of the double-sided tape 40c is the position opposing to the rib 7c. The double-sided tape 6c is extended to a space 61c formed between the resin chassis 3c and the display device 1. As the double-sided tape 6c, it is also possible to use a type exhibiting the light-shielding property. Further, through employing the same structure, a slit forming a shape that is not in a straight form can be formed and the double-sided tape 6c is extended also with the structure on the side where the double-sided tape 4c is pasted.

Next, the operations and effects of the display device of the third exemplary embodiment will be described. In the third exemplary embodiment, the double-sided tape 6c provided within the display device captures the foreign matter entered inside the display device from outside. Thereby, intrusion of the foreign matter into the inside of the display device can be suppressed, so that it is possible to prevent the image quality failures including the distortion of the image and deterioration of the image quality. Further, through using the type exhibiting the light-shielding property for the double-sided tape 6c, it is possible to suppress transmission of the unnecessary light into the space formed inside the display device, such as the light transmitting through the resin chassis 3c. With the display device of the third exemplary embodiment, the steps 31c and 32c suppress intrusion of the foreign matter to the inside the display device and the double-sided tape 6c pasted to the inside captures the foreign matter that is about to enter, so that intrusion of the foreign matter onto the display area can be prevented. Further, through suppressing the transmission of the unnecessary light into the space formed inside the display device, deterioration of the display quality can be prevented. Other structures, operations, and effects of the display device according to the third exemplary embodiment are the same as those of the first to second exemplary embodiments.

Figure 14:
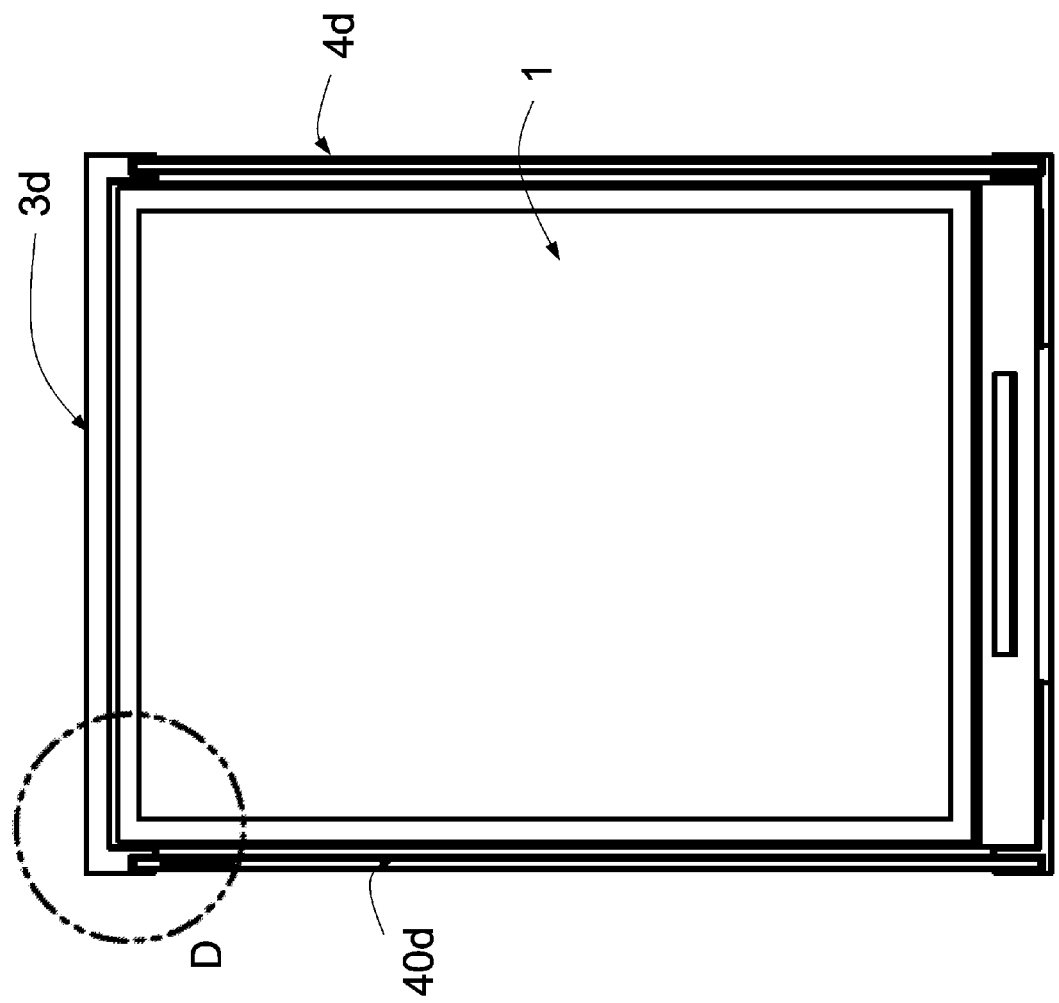
FIG. 14 is an elevational view showing a state where a touch panel is omitted from a display device according to a fourth exemplary embodiment of the present invention.
Figure 15:
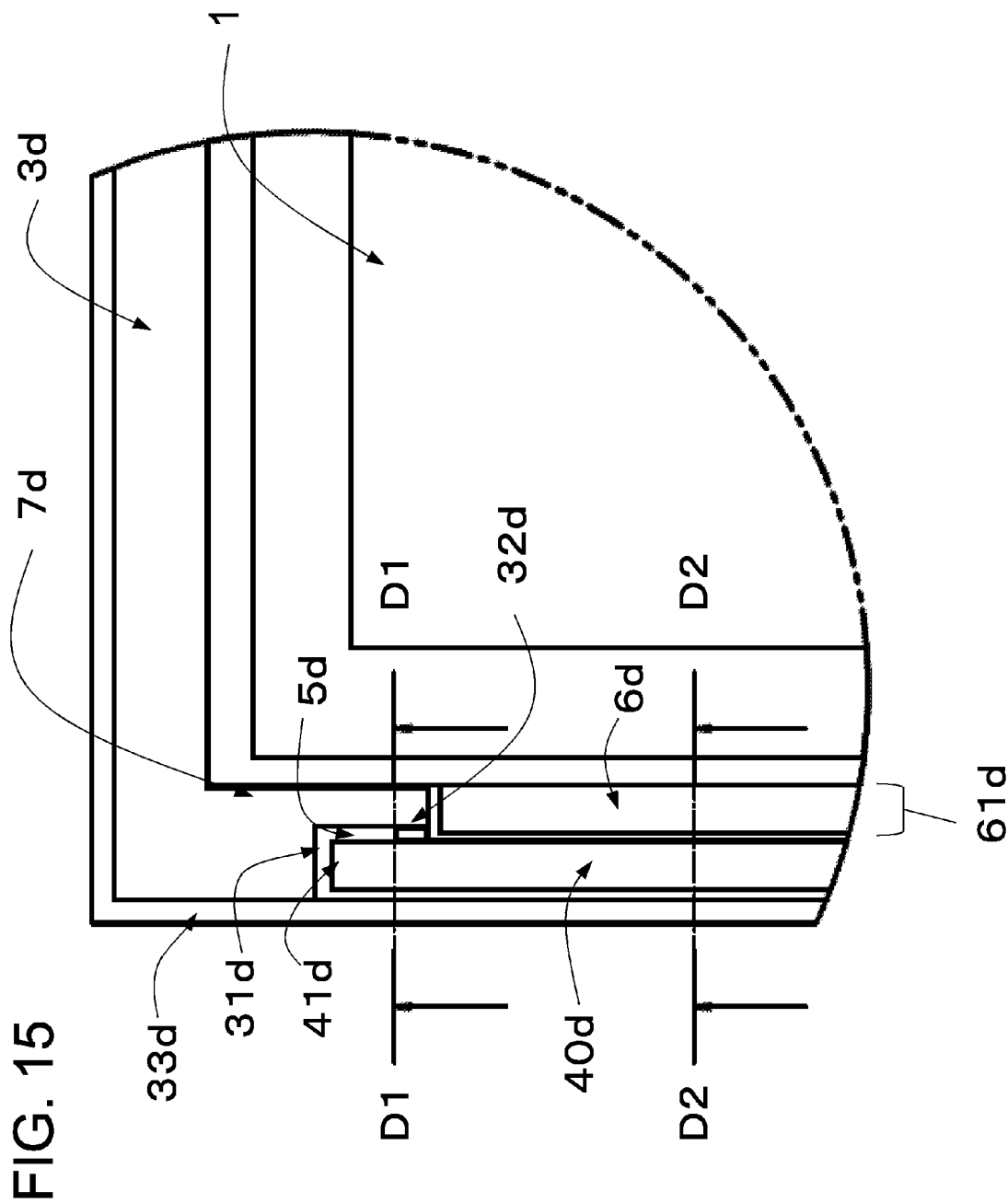
FIG. 15 is a detailed view showing D part of FIG. 14.
Figure 16:
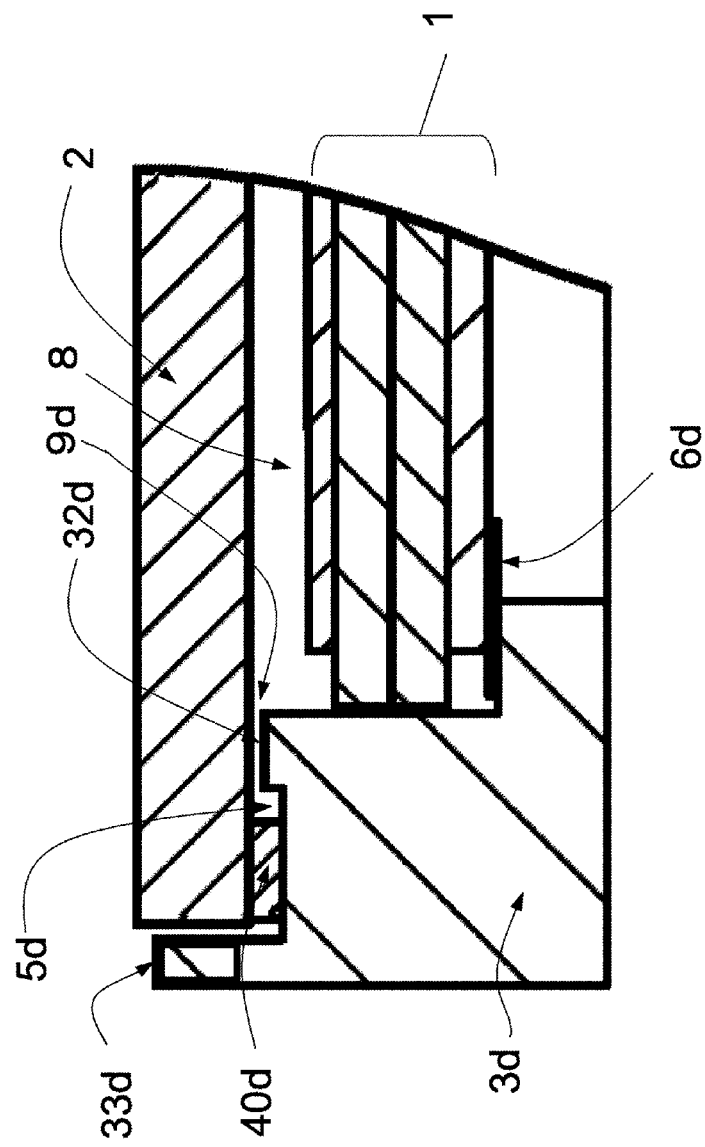
FIG. 16 is a sectional view taken along a line D1-D1 of FIG. 15, which shows the state where the touch panel is added.
Figure 17:
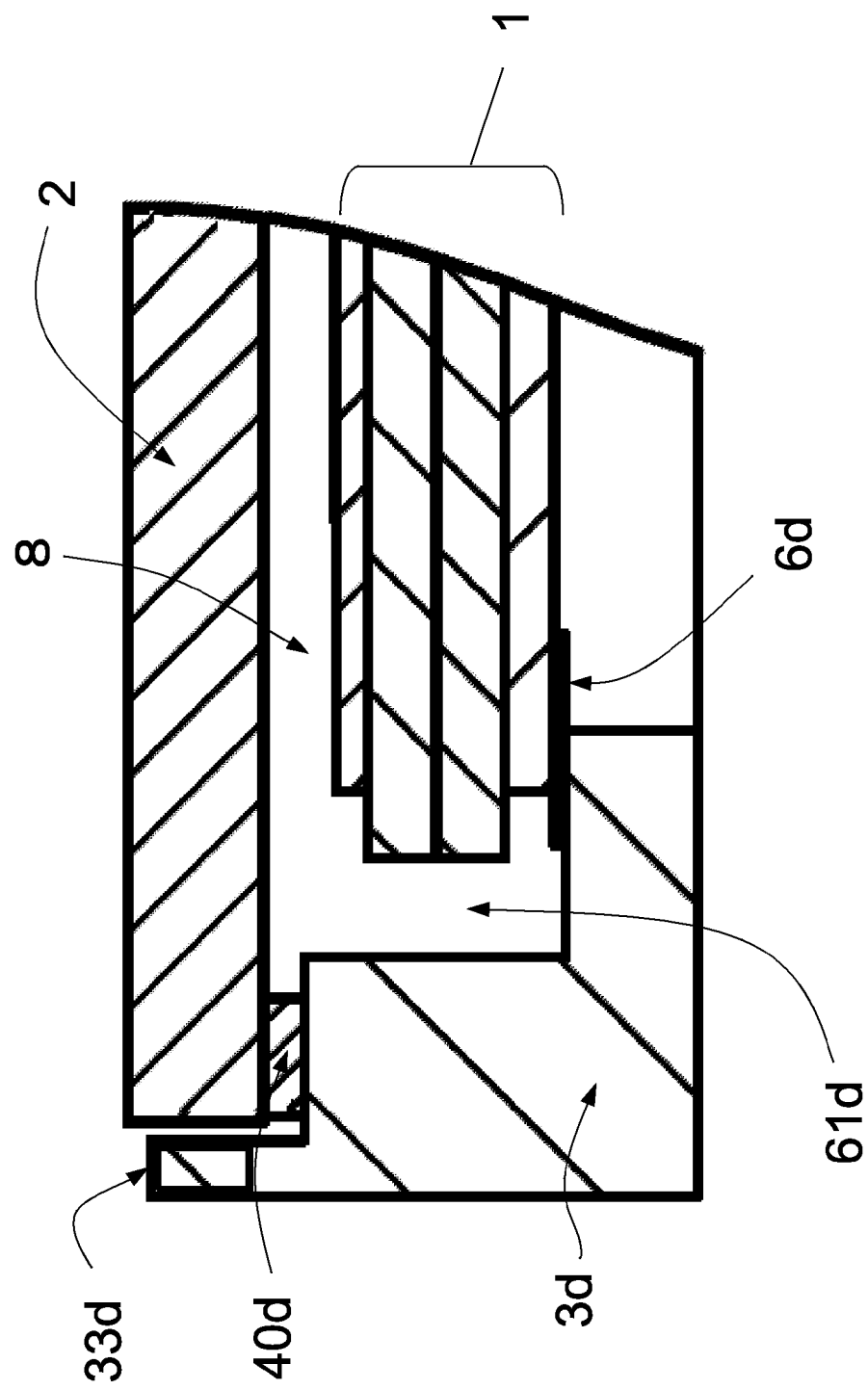
FIG. 17 is a sectional view taken along a line D2-D2 of FIG. 15, which shows the state where the touch panel is added.

FIG. 14 is an elevational view showing a state where a touch panel is omitted from a display device according to a fourth exemplary embodiment of the present invention. FIG. 15 is a detailed view showing D part of FIG. 14. FIG. 16 is a sectional view taken along a line D1-D1 of FIG. 15, which shows the state where the touch panel is added. FIG. 17 is a sectional view taken along a line D2-D2 of FIG. 15, which shows the state where the touch panel is added. Hereinafter, explanations will be provided by referring to those drawings.

Steps 31d and 32d of the display device according to a fourth exemplary embodiment are provided on a resin chassis 3d, which are a first protruded plane of the height lower than the thickness of double-sided tapes 4d and 40d. In the fourth exemplary embodiment, a slit 5d for capturing a foreign matter entering inside a space 8 and a double-sided tape 6d as an adhesive member for capturing a foreign matter entering inside the space 8 are provided. A step 33d is provided on the outside of the touch panel 2 of the resin chassis 3d, which is a second protruded plane having the height higher than the thickness of the double-sided tapes 4d, 40d.

This will be described in more details hereinafter. The display device of the fourth exemplary embodiment includes: the display device 1; the touch panel 2; the resin chassis 3d into which the display device 1 is fitted; the double-sided tapes 4d, 40d for fixing the touch panel 2 to the resin chassis 3d; and the double-sided tape 6d for fixing the display device 1 to the resin chassis 3d. To the inner face of the resin chassis 3d, the double-sided tapes 4d, 40d are pasted. In the part of the inner face where the double-sided tapes 4d, 40d are not pasted, the step 31d of the height equal to or less than the thickness of the double-sided tapes 4d, 40d is provided. The touch panel 2 is fixed to the resin chassis 3d via the double-sided tapes 4d, 40d.

The structure of the side to which the double-sided tape 40d is pasted will be described herein. The step 32d of the height equal to or less than the thickness of the double-sided tape 40d is provided on the resin chassis 3d between the tape 40d and the display device 1. The step 33d equal to or larger than the thickness of the double-sided tape 40d is provided on the external shape side of the resin chassis 3d. A clearance 9d formed between the step 32d and the touch panel 2 is set to be equal to or less than the size of the assumed foreign matter. A slit 5d formed by the end portion 41d of the double-sided tape 40d and the resin chassis 3d forms a shape having two corners. A rib 7d for guiding the fixation of the display device 1 is provided to the resin chassis 3d. The end portion 41d of the double-sided tape 40d is the position opposing to the rib 7d. The double-sided tape 6d is extended to a space 61d formed between the resin chassis 3d and the display device 1. The touch panel 2 is fixed to abut against the step 33d provided on the external shape of the double-sided tape 40d. Further, through employing the same structure, a slit forming a shape that is not in a straight form can be formed and the double-sided tape 6d is extended also with the structure on the side where the double-sided tape 4d is pasted.

Next, the operations and effects of the display device of the fourth exemplary embodiment will be described. In the fourth exemplary embodiment, the path (constituted with the step 33d and the like) possibly having the intrusion of the foreign matters is formed in the direction making a steric form with respect to the nonlinear slit 5d formed by the end portion 41d of the double-sided tape 40d and the resin chassis 3d to which the steps 31d, 32d are attached. For that, through capturing the foreign matter that is about to enter the inside of the display device from the outside within the slit 5d, intrusion of the foreign matter into the inside of the display device can be suppressed. Thus, it is possible to prevent the image quality failures including the distortion of the image and deterioration of the image quality. Further, the part (step 33d) which forms the path possibly having the intrusion of the foreign matter in the direction making a steric form can be utilized for aligning the fixing position of the touch panel (protection panel), so that the assembling work can be simplified. With the fourth exemplary embodiment, it is possible to improve the effect of suppressing the intrusion of the foreign matter to the inside of the display device and to simplify the attaching and assembling work of the touch panel 2 (protection panel) onto the resin chassis 3d. Other structures, operations, and effects of the display device according to the fourth exemplary embodiment are the same as those of the first to third exemplary embodiments.

Figure 18:
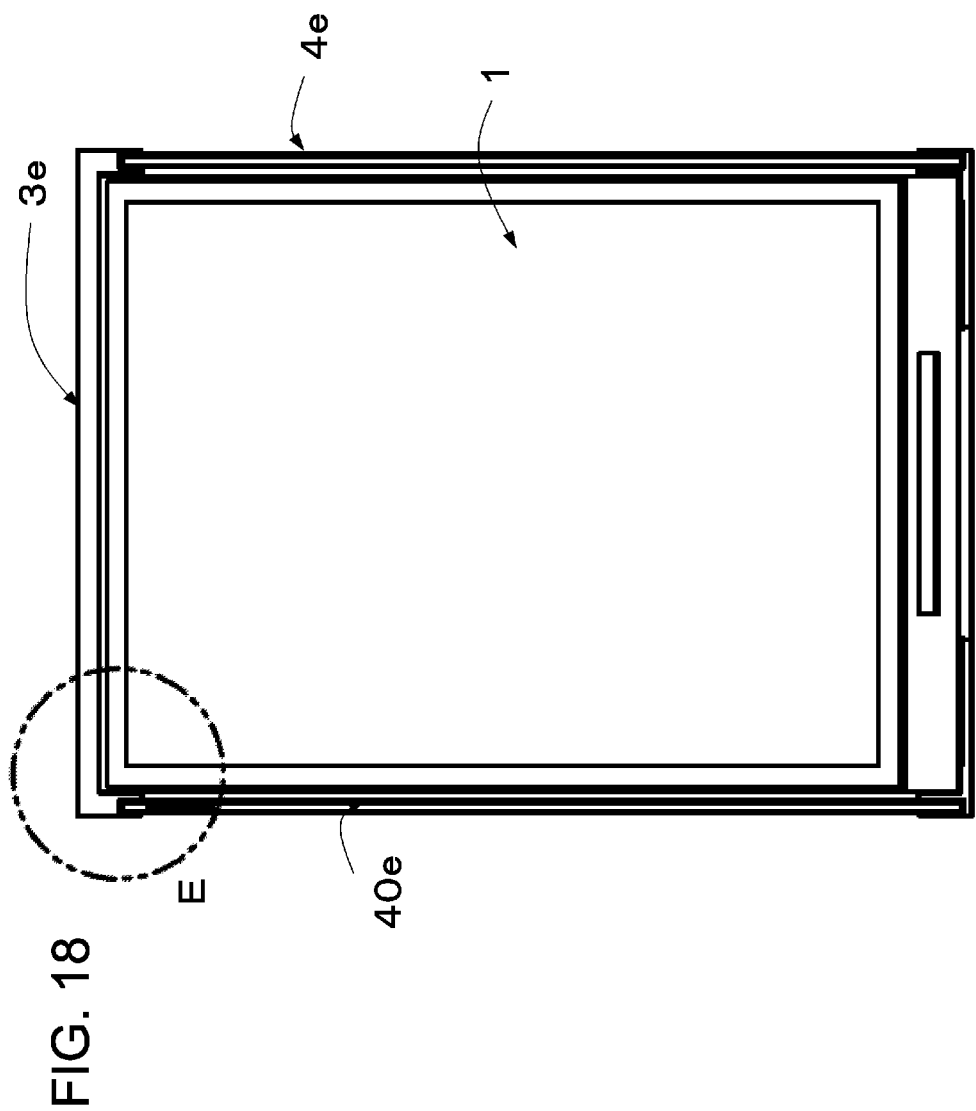
FIG. 18 is an elevational view showing a state where a touch panel is omitted from a display device according to a fifth exemplary embodiment of the present invention.
Figure 19:
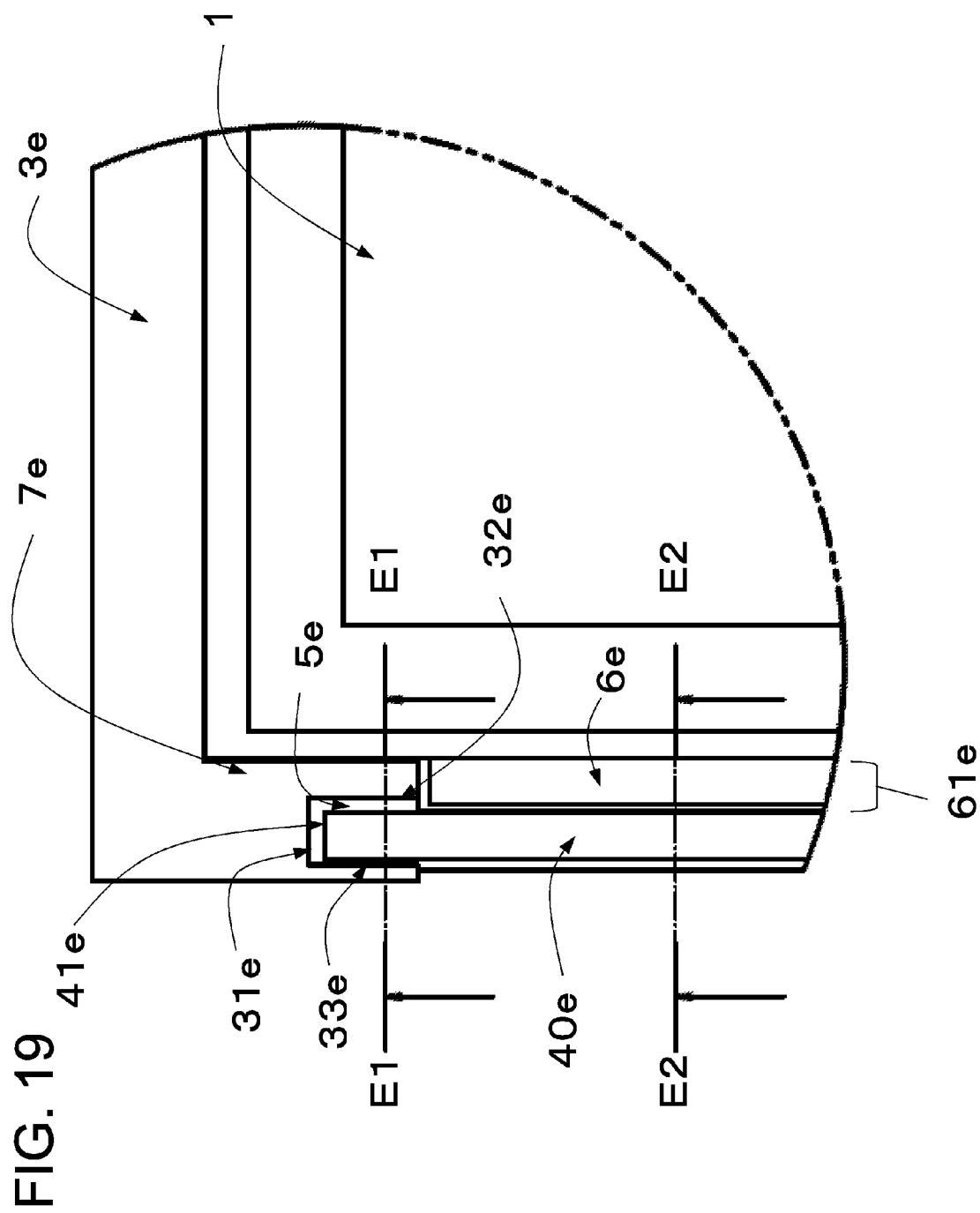
FIG. 19 is a detailed view showing E part of FIG. 18.
Figure 20:
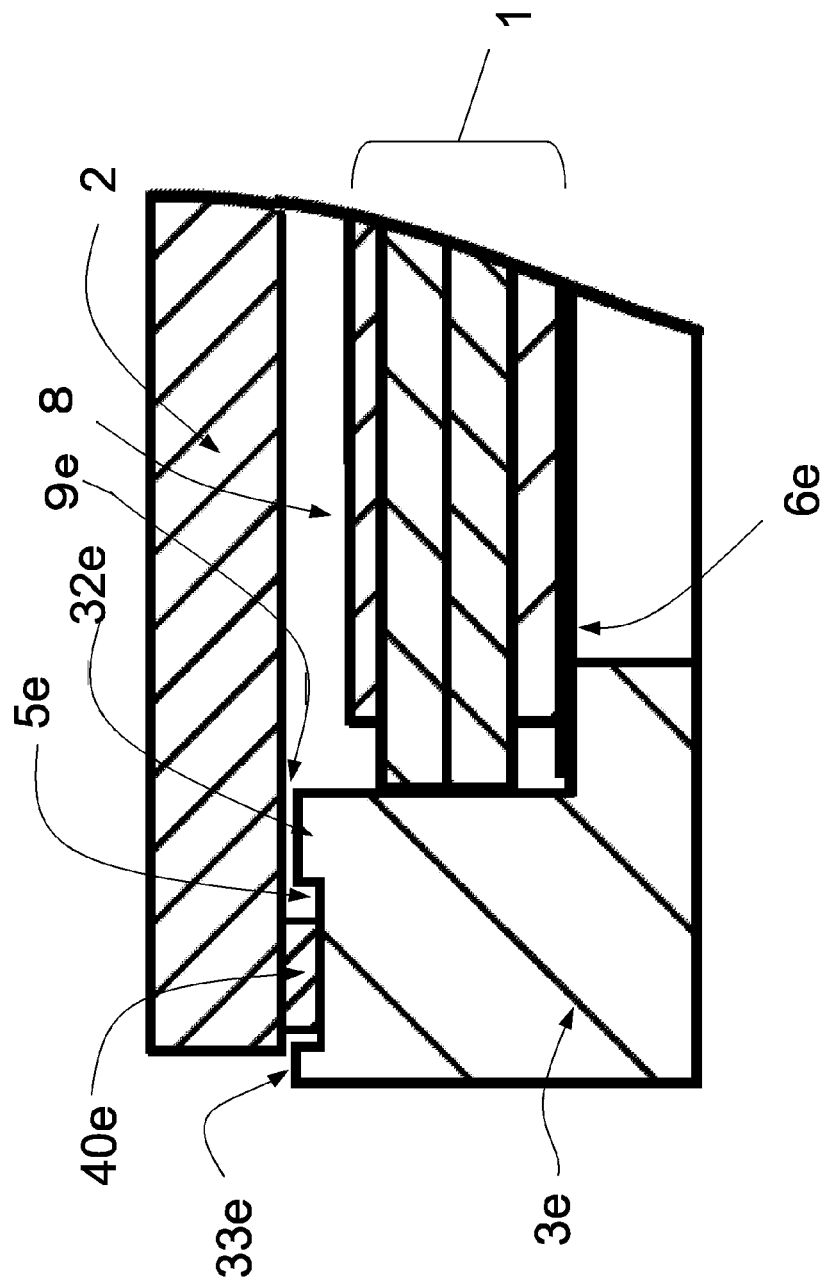
FIG. 20 is a sectional view taken along a line E1-E1 of FIG. 19, which shows the state where the touch panel is added.
Figure 21:
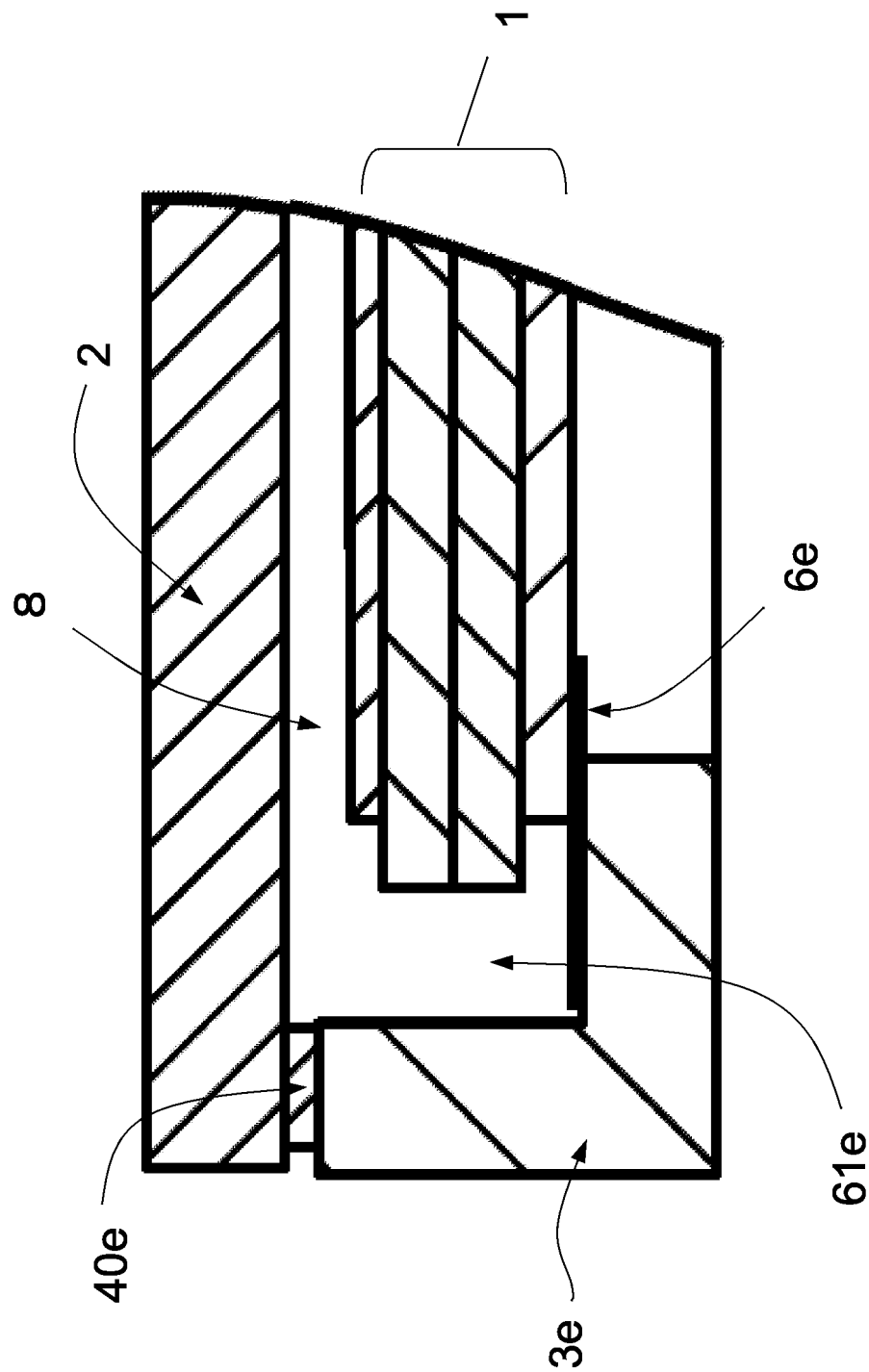
FIG. 21 is a sectional view taken along a line E2-E2 of FIG. 19, which shows the state where the touch panel is added.
Figure 22:
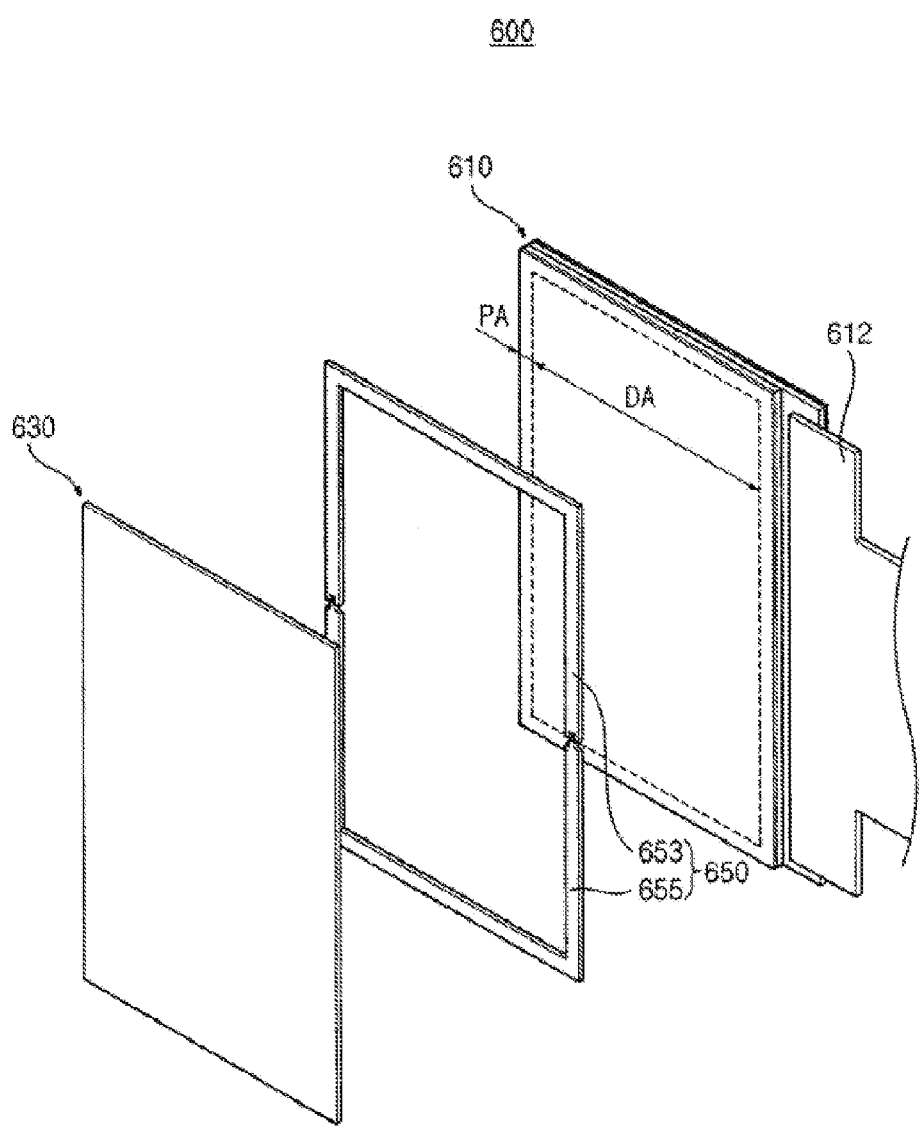
FIG. 22 is a fragmented perspective view showing a touch screen display device according to a related technique.
Figure 23:
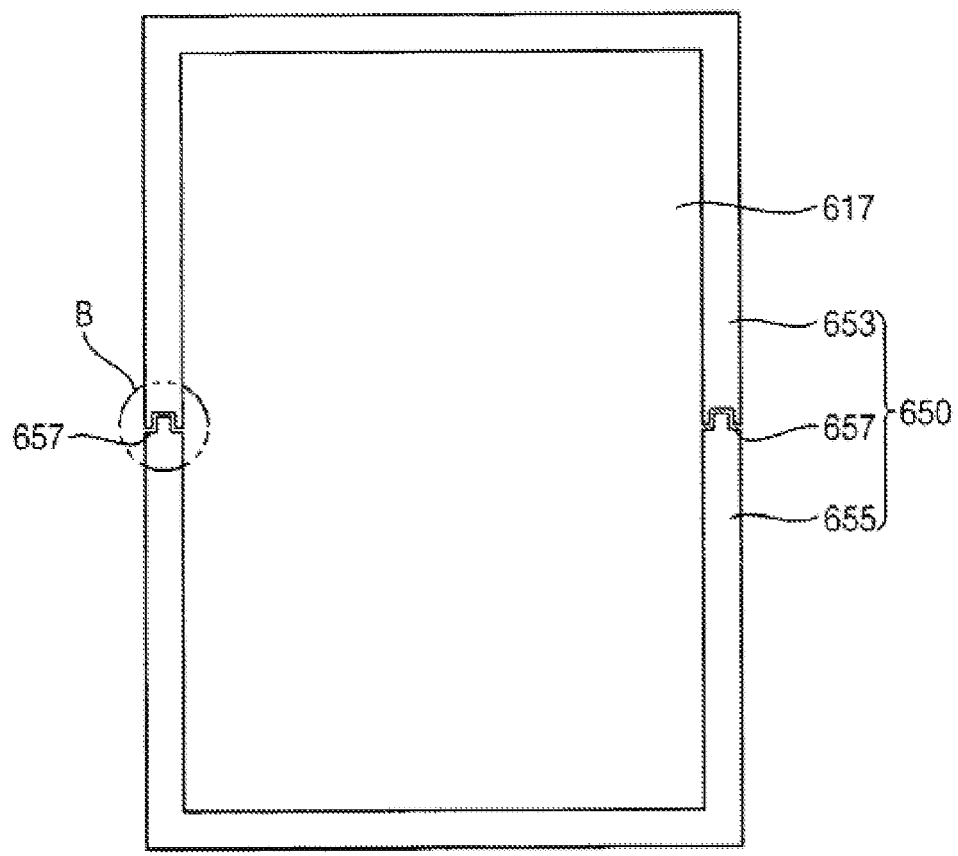
FIG. 23 is a plan view showing an adhesive member of the touch screen display device of FIG. 22.

FIG. 18 is an elevational view showing a state where a touch panel is omitted from a display device according to a fifth exemplary embodiment of the present invention. FIG. 19 is a detailed view showing E part of FIG. 18. FIG. 20 is a sectional view taken along a line E1-E1 of FIG. 19, which shows the state where the touch panel is added. FIG. 21 is a sectional view taken along a line E2-E2 of FIG. 19, which shows the state where the touch panel is added. Hereinafter, explanations will be provided by referring to those drawings.

Steps 31e and 32e of the display device according to a fifth exemplary embodiment are provided on a resin chassis 3e, which are a first protruded plane of the height lower than the thickness of double-sided tapes 4e and 40e. In the fifth exemplary embodiment, a slit 5e for capturing a foreign matter entering inside a space 8 and a double-sided tape 6e as an adhesive member for capturing a foreign matter entering inside the space 8 are provided. A step 33e is provided on the outside of the touch panel 2 of the resin chassis 3e, which is a third protruded plane having the height corresponding to the thickness of the steps 31e and 32e.

This will be described in more details hereinafter. The display device of the fifth exemplary embodiment includes: the display device 1; the touch panel 2; the resin chassis 3e into which the display device 1 is fitted; the double-sided tapes 4e, 40e for fixing the touch panel 2 to the resin chassis 3e; and the double-sided tape 6e for fixing the display device 1 to the resin chassis 3e. To the inner face of the resin chassis 3d, the double-sided tapes 4e, 40e are pasted. In the part of the inner face where the double-sided tapes 4e, 40e are not pasted, the step 31e of the height equal to or less than the thickness of the double-sided tapes 4e, 40e is provided. The touch panel 2 is fixed to the resin chassis 3e via the double-sided tapes 4e, 40e.

The structure of the side to which the double-sided tape 40e is pasted will be described herein. The steps 32e, 33e of the height equal to or less than the thickness of the double-sided tape 40e is provided on the resin chassis 3e between the double-sided tape 40e and the display device 1. The steps 32e, 33e equal to or larger than the thickness of the double-sided tape 4e is provided on the resin chassis 3e. A clearance 9e formed between the steps 32e, 33e and the touch panel 2 is set to be equal to or less than the size of the assumed foreign matter. A slit 5e formed by the end portion 41e of the double-sided tape 40e and the resin chassis 3e forms a shape having three or more corners. A rib 7e for guiding the fixation of the display device 1 is provided to the resin chassis 3e. The end portion 41e of the double-sided tape 40e is the position opposing to the rib 7e. The double-sided tape 6e is extended to a space 61e formed between the resin chassis 3e and the display device 1. Further, through employing the same structure, a slit forming a shape with three or more corners can be formed and the double-sided tape 6e is extended also with the structure on the side where the double-sided tape 4e is pasted.

Next, the operations and effects of the display device of the fifth exemplary embodiment will be described. In the fifth exemplary embodiment, the foreign matter about to be enter the inside of the display device from outside can be captured inside the slit 5e through forming the nonlinear and long-shaped slit 5e by the end portion 41e of the double-sided tape 40e and the resin chassis 3e to which the steps 32e, 33e are provided. Thereby, intrusion of the foreign matter into the inside of the display device can be suppressed, so that it is possible to prevent the image quality failures including the distortion of the image and deterioration of the image quality. With the fifth exemplary embodiment, it is possible to improve the effect of suppressing the intrusion of the foreign matter to the inside of the display device and to reduce the size of the display device. Other structures, operations, and effects of the display device according to the fifth exemplary embodiment are the same as those of the first to fourth exemplary embodiments.

While the present invention has been described above by referring to each of the exemplary embodiments shown in the drawings, the present invention is not limited only to each of the exemplary embodiments described above. Regarding the structures and details of the present invention, various changes and modifications occurred to those skilled in the art can be applied. Further, the present invention includes the structures acquired by properly and mutually combining a part of or a whole part of the structures of each of the above-described exemplary embodiments.

Next, the first to fifth exemplary embodiments will be summarized. The display device according to the exemplary embodiments is the display device having the structure in which the touch panel, the protection panel, and the like are fixed to the resin chassis via the double-sided tape, with which intrusion of the foreign matters into the inside of the display device from the gap between the touch panel as well as the protection panel and the resin chassis is prevented by devising the structure of the resin chassis to which the double-sided tape is pasted. That is, the steps of the height equal to or less than the thickness of the double-sided tape is provided on the resin chassis to which the double-sided tape for fixing the protection panel is pasted to provide the wall between the end portion of the double-sided tape and the display panel. Further, the step having a plane at a position lower than the display surface is provided between the double-sided tape for fixing the protection panel and the display panel. With the exemplary embodiments, it is possible to prevent image quality failure caused by intrusion of the foreign matter into the inside of the display device with a simple-shaped adhesive member, so that the cost can be lowered. Furthermore, with the structure in which the shape of the double-sided tape is simplified, it is possible achieve the structure capable of suppressing intrusion of the foreign matter into the inside of the display device at a low cost and also to improve the workability for fixing the double-sided tape on the resin chassis.

While a part of or a whole part of the exemplary embodiments can be summarized as follows, the present invention is not necessarily limited only to the followings.

(Supplementary Note 1)

A display device which includes:

a display panel;

a chassis for housing the display panel;

a protection panel which covers the display panel via a space;

an adhesive member which fixes the protection panel to a rim of the chassis; and a protruded portion provided at least in one of the surfaces of the chassis and the protection panel opposing to each other, which forms a gap to be a flowing path of air on the inside and outside of the space.

(Supplementary Note 2)

The display device as depicted in Supplementary Note 1, wherein the protruded portion is provided to the chassis, which is a first protruded plane of height lower than the thickness of the adhesive member.

(Supplementary Note 3)

The display device as depicted in Supplementary Note 1 or 2, which further includes a second protruded plane of height higher than the thickness of the adhesive member, which is provided on the outside of the protection panel of the chassis.

(Supplementary Note 4)

The display device as depicted in Supplementary Note 1 or 2, which further includes a third protruded plane of height corresponding to the height of the protruded portion, which is provided on the outside of the adhesive member of the chassis.

(Supplementary Note 5)

The display device as depicted in any one of Supplementary Notes 1 to 4, which further includes a slit for capturing a foreign matter entering inside the space.

(Supplementary Note 6)

The display device as depicted in any one of Supplementary Notes 1 to 4, which further includes an adhesive member for capturing a foreign matter entering inside the space.

(Supplementary Note 7)

The display device as depicted in Supplementary Note 6, wherein the adhesive member exhibits a light shielding property.

(Supplementary Note 8)

The display device as depicted in any one of Supplementary Notes 1 to 7, wherein the protection panel is a touch panel.

(Supplementary Note 9)

The display device as depicted in any one of Supplementary Notes 1 to 8, wherein the adhesive member is a double-sided tape.

(Supplementary Note 10)

The display device as depicted in Supplementary Note 6 or 7, wherein the adhesive member is a double-sided tape.

(Supplementary Note 11)

A display device which includes: a display panel; a protection panel placed on a display surface of the display panel via a space; a chassis for housing the display panel; and an adhesive member for fixing the protection panel to the chassis, wherein:
  a step of height equal to or less than thickness of the adhesive member is provided on a top surface of the chassis opposing to the protection panel;
  the adhesive member is placed in a region to be a lower level of the step; and
  a wall corresponding to an upper level of the step is provided in a region where an end portion of the adhesive member is placed so as to spatially separate the adhesive member and the display panel.

(Supplementary Note 12)

The display device as depicted in Supplementary Note 11, wherein the protection panel is a touch panel.

(Supplementary Note 13)

The display device as depicted in Supplementary Note 11, wherein the adhesive member is a double-sided tape.

(Supplementary Note 14)

The display device as depicted in Supplementary Note 11, wherein the wall provided to spatially separate the adhesive member and the display panel is placed at the end portion of the adhesive member.

(Supplementary Note 15)

The display device as depicted in Supplementary Note 14, wherein, in a region where the end portion of the adhesive member is placed, a wall of height corresponding to the upper level of the step is provided to spatially separate the adhesive member and an external part of the display device.

(Supplementary Note 16)

A display device which includes: a display panel; a protection panel placed on a display surface of the display panel via a space; a chassis for housing the display panel; and an adhesive member for fixing the protection panel to the chassis, wherein:
  a step of height equal to or less than thickness of the adhesive member is provided on a top surface of the chassis opposing to the protection panel;
  the adhesive member is placed in a region to be a lower level of the step;
  a wall corresponding to an upper level of the step is provided in a region where an end portion of the adhesive member is placed so as to spatially separate the adhesive member and the display panel; and
  another step having a plane at a position lower than the display surface of the display panel is provided between the display panel and the adhesive member.

(Supplementary Note 17)

The display device as depicted in Supplementary Note 16, wherein the protection panel is a touch panel.

(Supplementary Note 18)

The display device as depicted in Supplementary Note 16, wherein the adhesive member is a double-sided tape.

(Supplementary Note 19)

The display device as depicted in Supplementary Note 16, wherein, in a region where the end portion of the adhesive member is placed, a wall of height corresponding to the upper level of the step is provided to spatially separate the adhesive member and an external part of the display device.

(Supplementary Note 20)

The display device as depicted in Supplementary Note 16, wherein, in a region where the end portion of the adhesive member is placed, a wall of height higher than the upper level of the step is provided to spatially separate the adhesive member and an external part of the display device.

(Supplementary Note 21)

The display device as depicted in Supplementary Note 16, wherein the adhesive member is placed on the plane part of another step mentioned above.

(Supplementary Note 22)

The display device as depicted in Supplementary Note 21, wherein the adhesive member exhibits a light shielding property.

(Supplementary Note 23)

The display device as depicted in Supplementary Note 16, wherein the display panel and the chassis are fixed via an adhesive member.

(Supplementary Note 24)

The display device as depicted in Supplementary Note 23, wherein the adhesive member is in a shape extended to a region of another step mentioned above.

(Supplementary Note 25)

The display device as depicted in Supplementary Note 24, wherein the adhesive member exhibits a light shielding property.

INDUSTRIAL APPLICABILITY

The present invention can be utilized for display devices such as a liquid crystal display, an organic EL display, and the like, for example.

REFERENCE NUMERALS

First Exemplary Embodiment

1 Display device (Display panel)
2 Touch pane (Protection panel)
3 Chassis
3a Resin chassis (Chassis)
31a, 32a Step (Protruded portion, First protruded plane)
4a, 40a Double-sided tape (Adhesive member)
41a End portion of double-sided tape
5a Slit
8 Space
9a Clearance Second Exemplary Embodiment 3b Resin chassis (Chassis)
31b, 32b Step (Protruded portion, First protruded plane)

4b, 40b Double-sided tape (Adhesive member)
41b End portion of double-sided tape
5b Slit
9b Clearance Third Exemplary Embodiment 3c Resin chassis (Chassis)
31c, 32c Step (Protruded portion, First protruded plane)
4c, 40c Double-sided tape (Adhesive member)
41c End portion of double-sided tape
5c Slit
6c Double-sided tape (Adhesive member)
61c Space
7c Rib
9c Clearance Fourth Exemplary Embodiment 3d Resin chassis (Chassis)
31d, 32d Step (Protruded portion, First protruded plane)
33d Step (Second protruded plane)
4d, 40d Double-sided tape (Adhesive member)
41d End portion of double-sided tape
5d Slit
6d Double-sided tape (Adhesive member)
61d Space
7d Rib
9d Clearance Fifth Exemplary Embodiment 3e Resin chassis (Chassis)
31e, 32e Step (Protruded portion, First protruded plane)
33e Step (Third protruded plane)
4e, 40e Double-sided tape (Adhesive member)
41e End portion of double-sided tape
5e Slit
6e Double-sided tape (Adhesive member)
61e Space
7e Rib
9e Clearance

The invention claimed is:

1. A display device, comprising: a display panel; a protection panel placed on a display surface of the display panel via a space; a chassis for housing the display panel; and an adhesive member for fixing the protection panel to the chassis, wherein:
   a step is provided on a top surface of the chassis opposing to the protection panel by having the top surface as a lower level and having a height equal to or less than thickness of the adhesive member as an upper level;
   the adhesive member is placed in a region to be the lower level of the step;
   the upper level of the step is provided in such a manner that the adhesive member and the display panel are separated by a nonlinear slit-like space;
   the nonlinear slit-like space is provided between the upper level and the protection panel; and
   the nonlinear slit-like space is placed at a longitudinal end portion of the adhesive member.

2. The display device as claimed in claim 1, wherein the protection panel is a touch panel.

3. The display device as claimed in claim 1, wherein the adhesive member is a double-sided tape.

4. The display device as claimed in claim 1, wherein the step is a first step, and wherein, in a region where the longitudinal end portion of the adhesive member is placed, a second step having the height corresponding to the upper level of the first step as an upper level is further provided to spatially separate the adhesive member and an external part of the display device.

5. A display device, comprising: a display panel; a protection panel placed on a display surface of the display panel via a first space; a chassis for housing the display panel; and an adhesive member for fixing the protection panel to the chassis, wherein:
   a step is provided on a top surface of the chassis opposing to the protection panel by having the top surface as a lower level and having a height equal to or less than thickness of the adhesive member as an upper level;
   the adhesive member is placed in a region to be the lower level of the step;
   the upper level of the step is provided in such a manner that the adhesive member and the display panel are separated by a nonlinear slit-like space;
   the nonlinear gap which becomes the first space is provided between the upper level and the protection panel;
   a second space having a plane at a position lower than the display surface of the display panel and being communicated with the first space is provided to the chassis between the display panel and the adhesive member; and
   the nonlinear slit-like space is placed at a longitudinal end portion of the adhesive member.

6. The display device as claimed in claim 5, wherein the protection panel is a touch panel.

7. The display device as claimed in claim 5, wherein the adhesive member is a double-sided tape.

8. The display device as claimed in claim 5, wherein the step is a first step, and wherein, in a region where the longitudinal end portion of the adhesive member is placed, a second step having a height corresponding to the upper level of the first step as an upper level is further provided to spatially separate the adhesive member and an external part of the display device.

9. The display device as claimed in claim 8, wherein, in a region where the longitudinal end portion farther from the display panel of the adhesive member is placed, a third step having the height higher than the upper level of the first step as an upper level is further provided to spatially separate the adhesive member and an external part of the display device.

10. The display device as claimed in claim 5, wherein the adhesive member is placed on the plane part.

11. The display device as claimed in claim 10, wherein the adhesive member exhibits a light shielding property.

12. The display device as claimed in claim 5, wherein the display panel and the chassis are fixed via an adhesive member.

13. The display device as claimed in claim 12, wherein the adhesive member is in a shape extended on the plane corresponding to all over the second space.

14. The display device as claimed in claim 13, wherein the adhesive member exhibits a light shielding property.

* * * * *